United States Patent
Kusakabe

(10) Patent No.: US 10,115,680 B2
(45) Date of Patent: Oct. 30, 2018

(54) SEMICONDUCTOR MEMORY DEVICE AND METHOD FOR MANUFACTURING THE SAME

(71) Applicant: Toshiba Memory Corporation, Minato-ku (JP)

(72) Inventor: Takeshi Kusakabe, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/703,333

(22) Filed: Sep. 13, 2017

(65) Prior Publication Data
US 2018/0277494 A1    Sep. 27, 2018

(30) Foreign Application Priority Data
Mar. 22, 2017  (JP) ................. 2017-056413

(51) Int. Cl.
| H01L 23/00 | (2006.01) |
| H01L 27/115 | (2017.01) |
| H01L 23/544 | (2006.01) |
| H01L 27/1157 | (2017.01) |
| H01L 27/11565 | (2017.01) |
| H01L 27/11582 | (2017.01) |

(52) U.S. Cl.
CPC .......... *H01L 23/562* (2013.01); *H01L 23/544* (2013.01); *H01L 27/1157* (2013.01); *H01L 27/11565* (2013.01); *H01L 27/11582* (2013.01); *H01L 2223/54426* (2013.01)

(58) Field of Classification Search
None
See application file for complete search history.

(56) References Cited

U.S. PATENT DOCUMENTS 8,581,414 B2  11/2013  Fujita
8,749,078 B2  6/2014  Murakami
(Continued)

FOREIGN PATENT DOCUMENTS

JP       2013-187338       9/2013
WO    WO 2017/034646 A1   3/2017

OTHER PUBLICATIONS

Aochi, Hideaki. "BiCS Flash as a Future 3D Non-Volatile Memory Technology for Ultra High Density Storage Devices." 2009 IEEE International Memory Workshop, 2009, doi:10.1109/imw.2009. 5090581.*

*Primary Examiner* — Joseph Schoenholtz
(74) *Attorney, Agent, or Firm* — Oblon, McClelland, Maier & Neustadt, L.L.P.

(57) ABSTRACT

According to an embodiment, a semiconductor memory device includes a substrate, a first stacked body, a columnar part, a second insulating film, and a second stacked body. The first stacked body is provided in a first region on the substrate. The second insulating film is provided in a second region on the substrate, and has a first thickness in a stacking direction of the first stacked body. The second stacked body is provided on the second insulating film. The second stacked body includes a first film and a third insulating film stacked alternately on one another. The uppermost first film in the first films of the second stacked body is located at a first distance in the stacking direction from the upper surface of the substrate. The first thickness is a thickness not less than 30 percent of the first distance.

20 Claims, 26 Drawing Sheets

(56) References Cited

U.S. PATENT DOCUMENTS

| | | |
|---|---|---|
| 2010/0227451 A1 | 9/2010 | Suzuki |
| 2012/0032250 A1 | 2/2012 | Son et al. |
| 2014/0357054 A1 | 12/2014 | Son et al. |
| 2015/0036407 A1* | 2/2015 | Nakajima ............ H01Q 1/2283 365/63 |
| 2015/0236038 A1 | 8/2015 | Pachamuthu et al. |
| 2016/0020169 A1* | 1/2016 | Matsuda ............... H01L 23/528 257/758 |
| 2016/0111436 A1 | 4/2016 | Ding et al. |
| 2017/0098655 A1* | 4/2017 | Costa ................ H01L 27/11524 |

* cited by examiner

SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2017-056413, filed on Mar. 22, 2017; the entire contents of which are incorporated herein by reference.

FIELD

Embodiments relate generally to a semiconductor memory device and a method for manufacturing the same.

BACKGROUND

There has been proposed a semiconductor memory device having a three-dimensional structure in which a stacked body having a plurality of electrode films stacked via respective insulating films is provided with memory holes, and a channel is disposed on a sidewall of each of the memory holes via a charge storage film. The electrode films each function as a control gate in the memory cell, and by increasing the number of electrode films stacked, the number of memory cells can be increased.

Since the aspect ratio of the memory hole rises due to the increase in the number of electrode films stacked, formation of the stacked bodies and the memory holes is performed in a phased manner. In order to form the memory holes penetrating the upper and lower stacked bodies, there are formed an alignment mark and an overlay mark to perform the alignment between the lower stacked body and the upper stacked body. In the process of forming such an alignment mark and such an overlay mark, there is desired reduction in cost.

DETAILED DESCRIPTION

Figure 1:
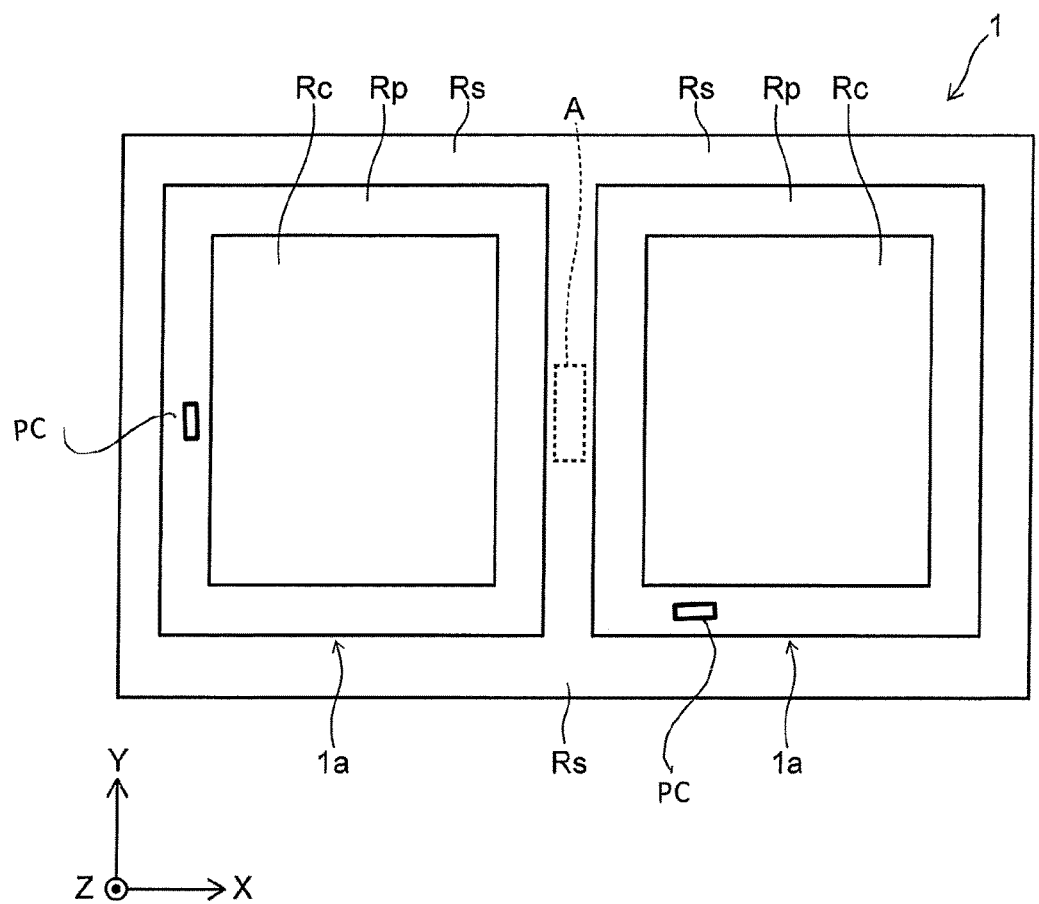
FIG. 1 is a plan view showing a semiconductor memory device according to a first embodiment.

According to an embodiment, a semiconductor memory device includes a substrate, a first stacked body, a columnar part, a second insulating film, and a second stacked body. The first stacked body is provided in a first region on the substrate. The first stacked body includes a first insulating film and an electrode film stacked alternately on one another. The columnar part is provided in the first stacked body, and extends in a stacking direction of the first stacked body. The columnar part includes a connection part widened in width in a first direction along an upper surface of the substrate. The second insulating film is provided in a second region on the substrate, and has a first thickness in the stacking direction. The second stacked body is provided on the second insulating film. The second stacked body includes a first film and a third insulating film stacked alternately on one another. The uppermost first film in the first films of the second stacked body is located at a first distance in the stacking direction from the upper surface of the substrate. The first thickness is a thickness not less than 30 percent of the first distance.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

FIG. 1 is a plan view showing a semiconductor memory device 1.

It should be noted that in the embodiment, there is provided a substrate 10 (see FIG. 2 and so on) including silicon. Hereinafter, in the specification, for the sake of convenience of explanation, there is adopted an XYZ Cartesian coordinate system. Two directions parallel to an upper surface 10a of the substrate 10, and perpendicular to each other are defined as an "X-direction" and a "Y-direction," and a direction perpendicular to the upper surface 10a is defined as a "Z-direction."

As shown in FIG. 1, the semiconductor memory device 1 is provided with cell regions Rc, peripheral regions Rp, and a scribing region Rs.

In each of the cell regions Rc, there is provided a memory cell array including a plurality of memory cells. Viewed from the Z-direction, the shape of each of the cell regions Rc is, for example, a rectangular shape. For example, in each of the cell regions Rc, the both ends thereof in the X-direction are each processed to have a stepped shape.

The peripheral region Rp is located on the periphery of each of the cell regions Rc. Viewed from the Z-direction, the shape of each of the peripheral regions Rp is, for example, a frame-like shape. In each of the peripheral regions Rp, there are provided peripheral circuits PC such as a row decoder and a sense amplifier. The peripheral circuits PC in each of the peripheral regions Rp are electrically connected to the memory cell array via contacts provided to the end parts each having the stepped shape in the cell region Rc.

In the scribing region Rs, the semiconductor memory device 1 is segmentalized into a plurality of semiconductor memory devices 1a. In the scribing region Rs, there are formed dicing lines for segmentalizing the semiconductor memory device 1 into the plurality of semiconductor memory devices 1a. The plurality of semiconductor memory devices 1a is manufactured by forming a structure on a wafer having the substrate 10, and then dicing the wafer and the structure. Specifically, by dicing the scribing region Rs along the dicing lines, it results that the semiconductor memory devices 1a each have the cell region Rc and the peripheral region Rp.

In the example shown in FIG. 1, the dicing lines are formed along the outer edges of the peripheral regions Rp. Further, in an area A of the scribing region Rs, there is formed an alignment mark Ma described later.

Firstly, the flow of a method of manufacturing the memory cell array in the cell region Rc will briefly be described using FIG. 2 through FIG. 10.

FIG. 2 through FIG. 8 and FIG. 10 are cross-sectional views showing the method of manufacturing the semiconductor memory device according to the first embodiment.

Figure 8:
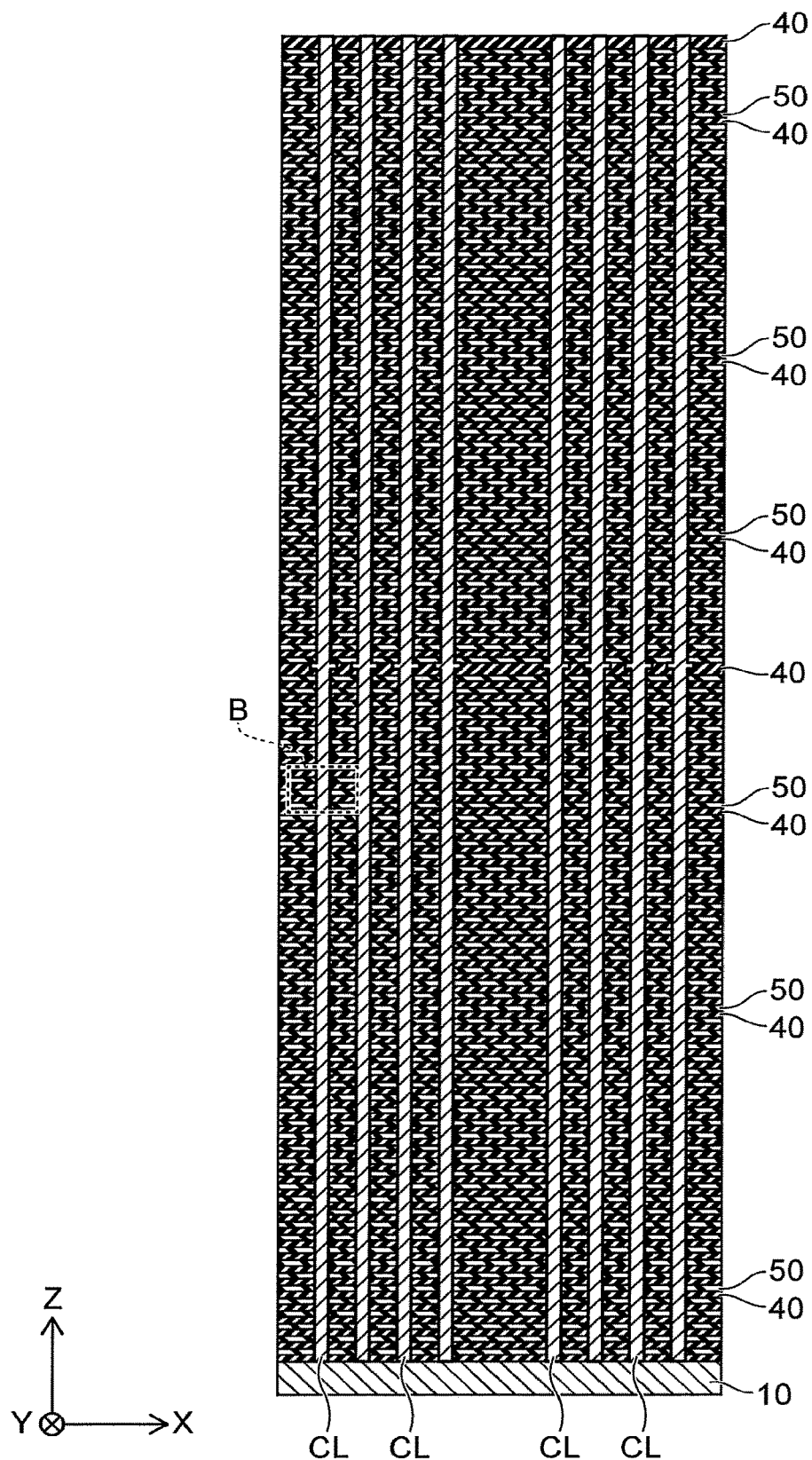
Figure 9:
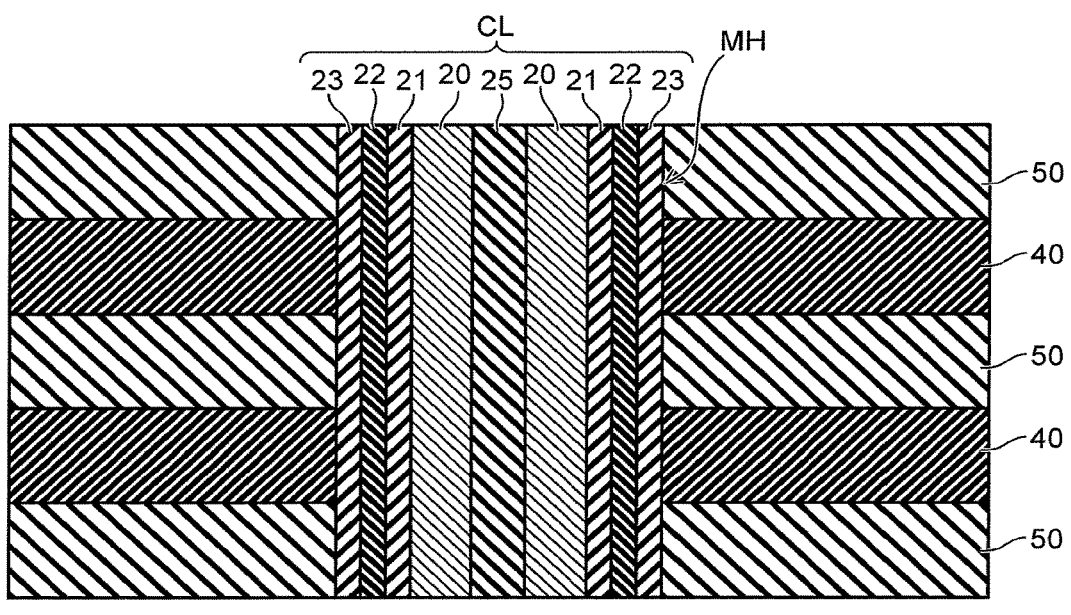
FIG. 9 is an enlarged view of an area B in FIG. 8.

FIG. 9 is an enlarged view of the area B shown in FIG. 8.

Figure 2:
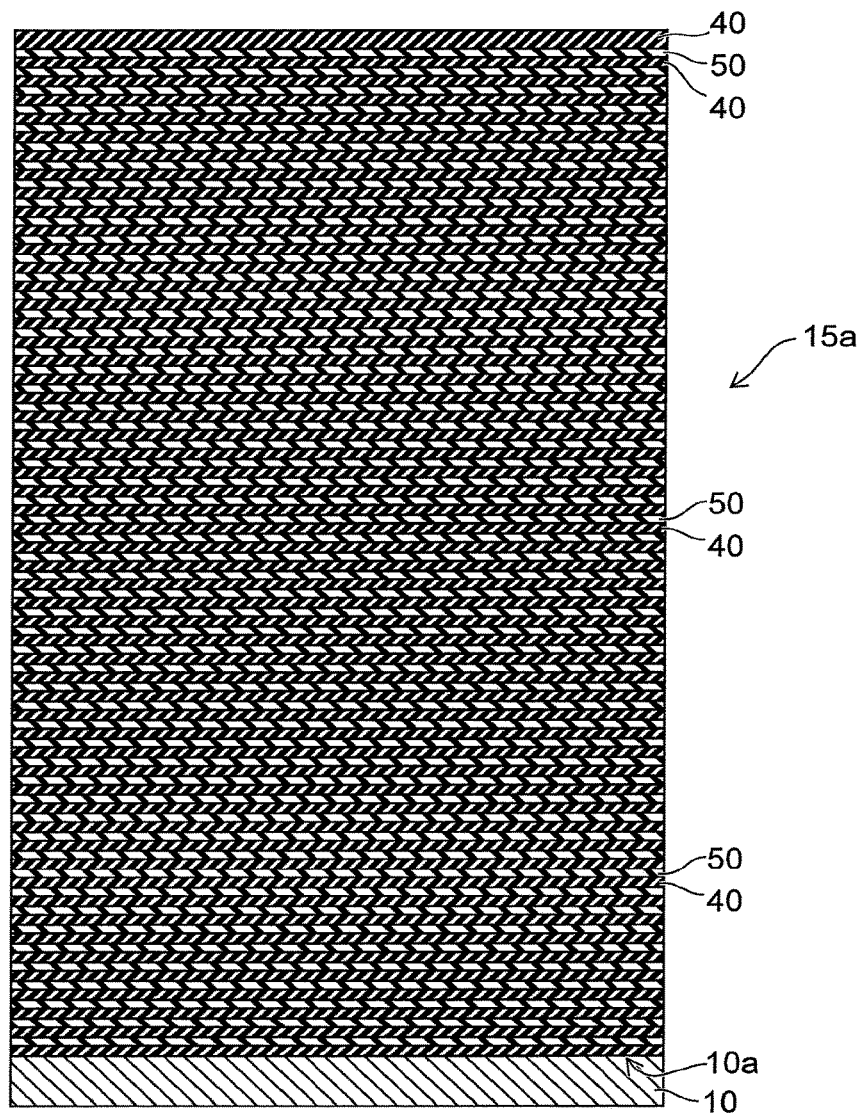
FIG. 2 to FIG. 8 are cross-sectional views showing a method for manufacturing the semiconductor memory device according to the first embodiment.

Firstly, as shown in FIG. 2, insulating films 40 and sacrificial films 50 are alternately stacked on one another along the Z-direction using, for example, a CVD (Chemical Vapor Deposition) method to form the stacked body 15a on the substrate 10 including silicon. It should be noted that the insulating films 40 and the sacrificial films 50 are alternately stacked so that the uppermost layer of the stacked body 15a becomes the insulating film 40.

The insulating films 40 are formed of, for example, silicon oxide. The sacrificial films 50 are formed of a material capable of providing a sufficient etching selectivity with the insulating films 40, and are formed of, for example, silicon nitride. For example, in the configuration, the number of the insulating films 40 stacked and the number of the sacrificial films 50 stacked are each in a range of 50 through 55.

Figure 3:
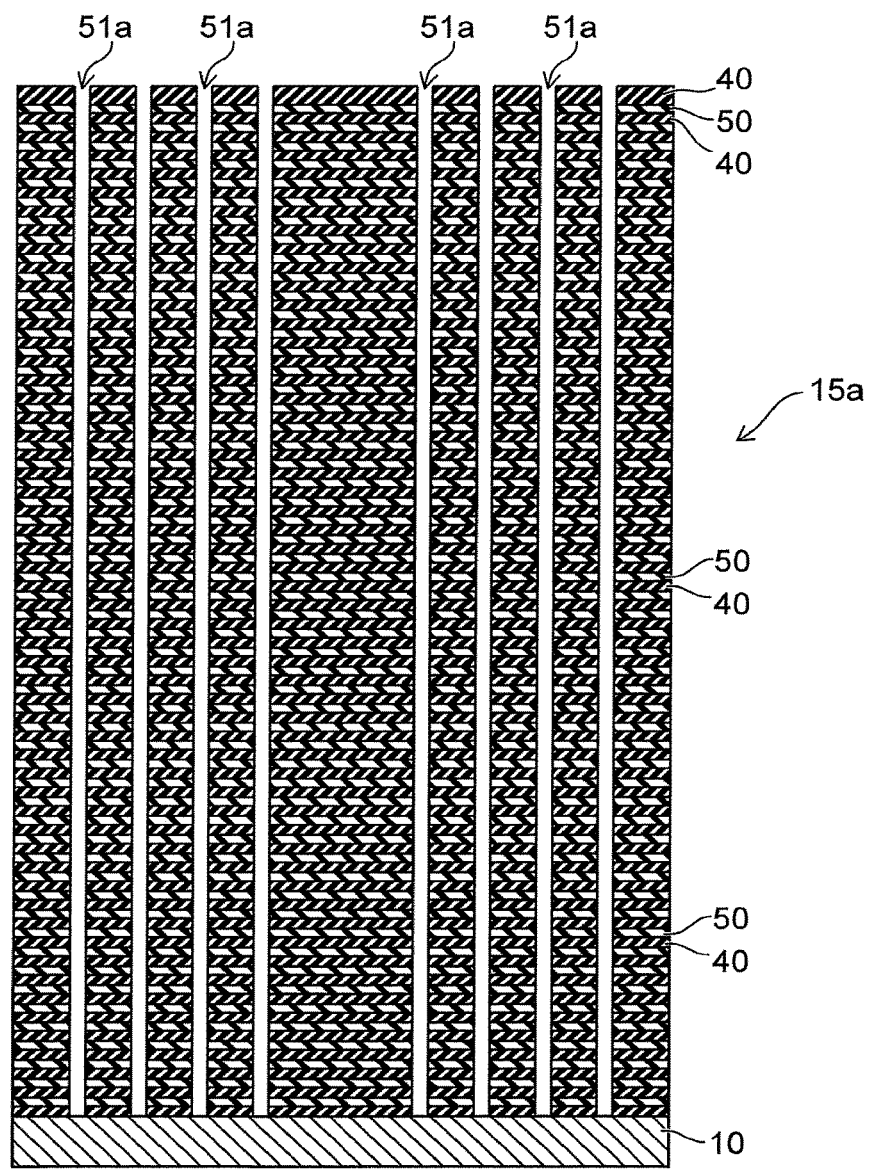

Then, as shown in FIG. 3, a plurality of through holes 51a is formed in the stacked body 15a by a photolithography process using a mask and an etching process such as RIE (Reactive Ion Etching).

Figure 4:
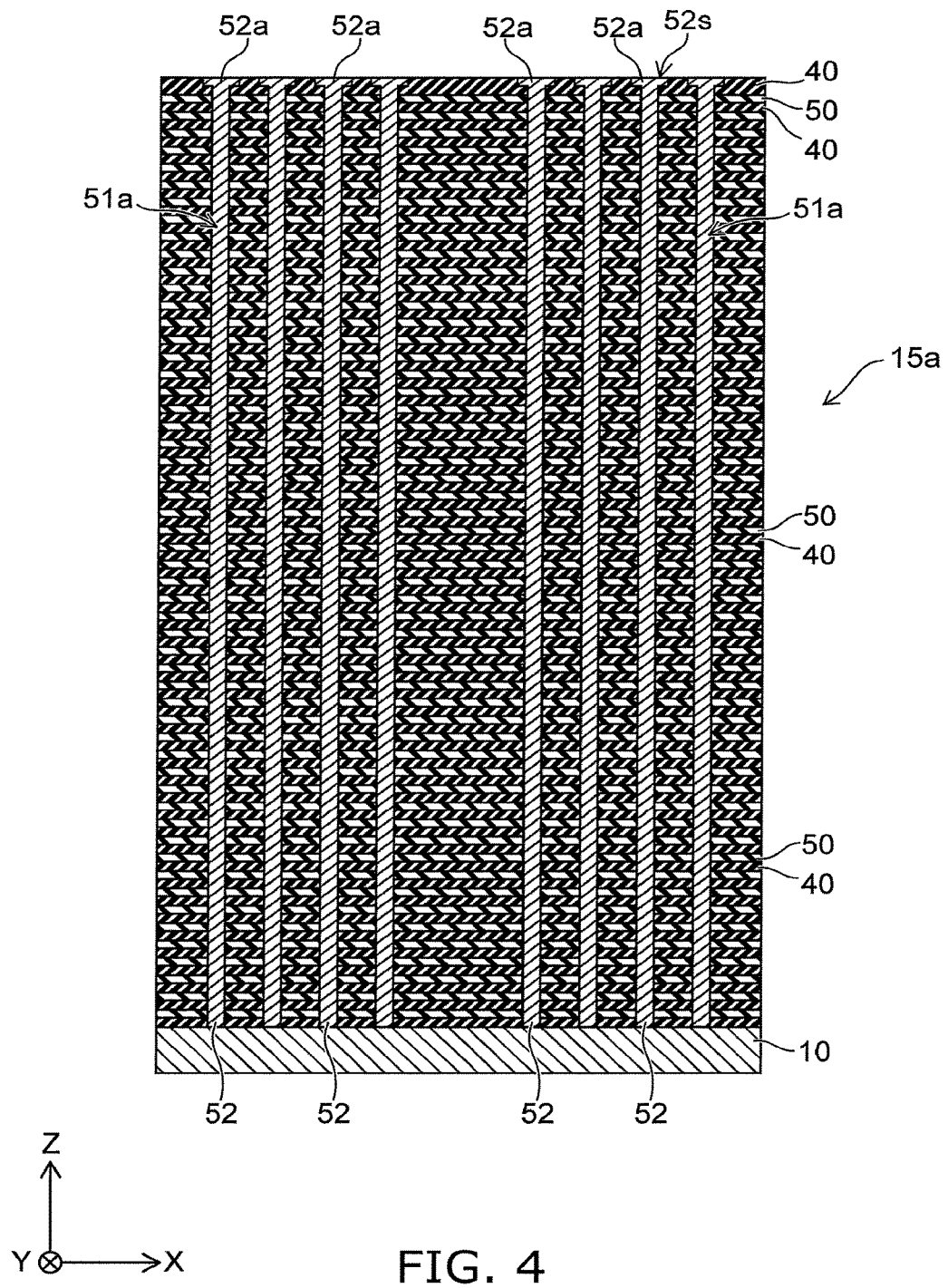

Then, as shown in FIG. 4, amorphous silicon or the like is deposited to form a sacrificial film 52 in each of the through holes 51a. The sacrificial films 52 can also be formed of polysilicon obtained by crystallizing the amorphous silicon. Subsequently, using an etching process such as RIE, the sacrificial film 52 located in each of the through holes 51a and in the insulating film 40 of the uppermost layer of the stacked body 15a is removed. Subsequently, by performing wet etching from the upper surface of each of the through holes 51a, the insulating film 40 of the uppermost layer of the stacked body 15a is partially removed. Thus, the width of the upper part of each of the through holes 51a is widened.

Subsequently, by depositing amorphous silicon or the like so as to fill the widened part in the upper part of each of the through holes 51a, and then etching back the amorphous silicon or the like, the sacrificial film 52 is formed in the upper part of each of the through holes 51a once again. Since the width of the upper part of each of the through holes 51a is widened, the sacrificial films 52 each have a connection part 52a with the width of the upper part widened. The connection parts 52a are located in the insulating film 40 of the uppermost layer of the stacked body 15a. For example, the upper surface 52s of each of the connection parts 52a is located on the same plane as the upper surface of the insulating film 40 of the uppermost layer.

Figure 5:
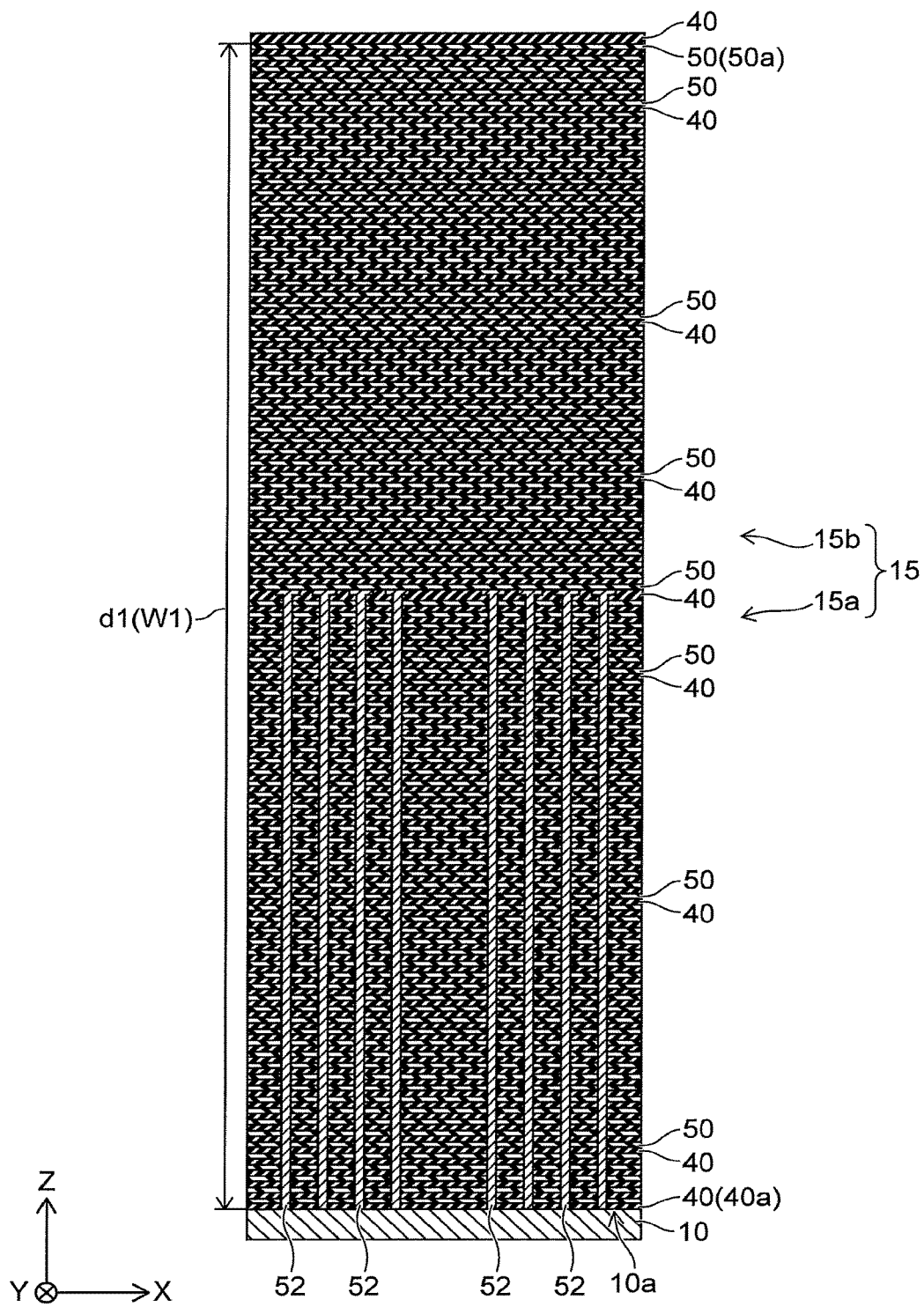

Then, as shown in FIG. 5, the sacrificial films 50 and the insulating films 40 are alternately stacked on one another along the Z-direction to form a stacked body 15b using, for example, a CVD method. It should be noted that the sacrificial films 50 and the insulating films 40 are alternately stacked so that the uppermost layer of the stacked body 15b becomes the insulating film 40. Thus, the stacked body 15 having the stacked body 15a and the stacked body 15b is formed. The stacked body 15a corresponds to a lower-stand part of the stacked body 15, and the stacked body 15b corresponds to an upper-stand part of the stacked body 15.

Here, the second uppermost sacrificial film 50a of the stacked body 15 is located at the distance d1 in the Z-direction from the upper surface 10a of the substrate 10. In the example shown in FIG. 5, the distance d1 corresponds to the thickness W1 of a part from the insulating film 40a of the lowermost layer to the second uppermost sacrificial film 50a in the stacked body 15. For example, the distance d1 is not less than 6.0 micrometer and not more than 7.0 micrometer.

Figure 6:
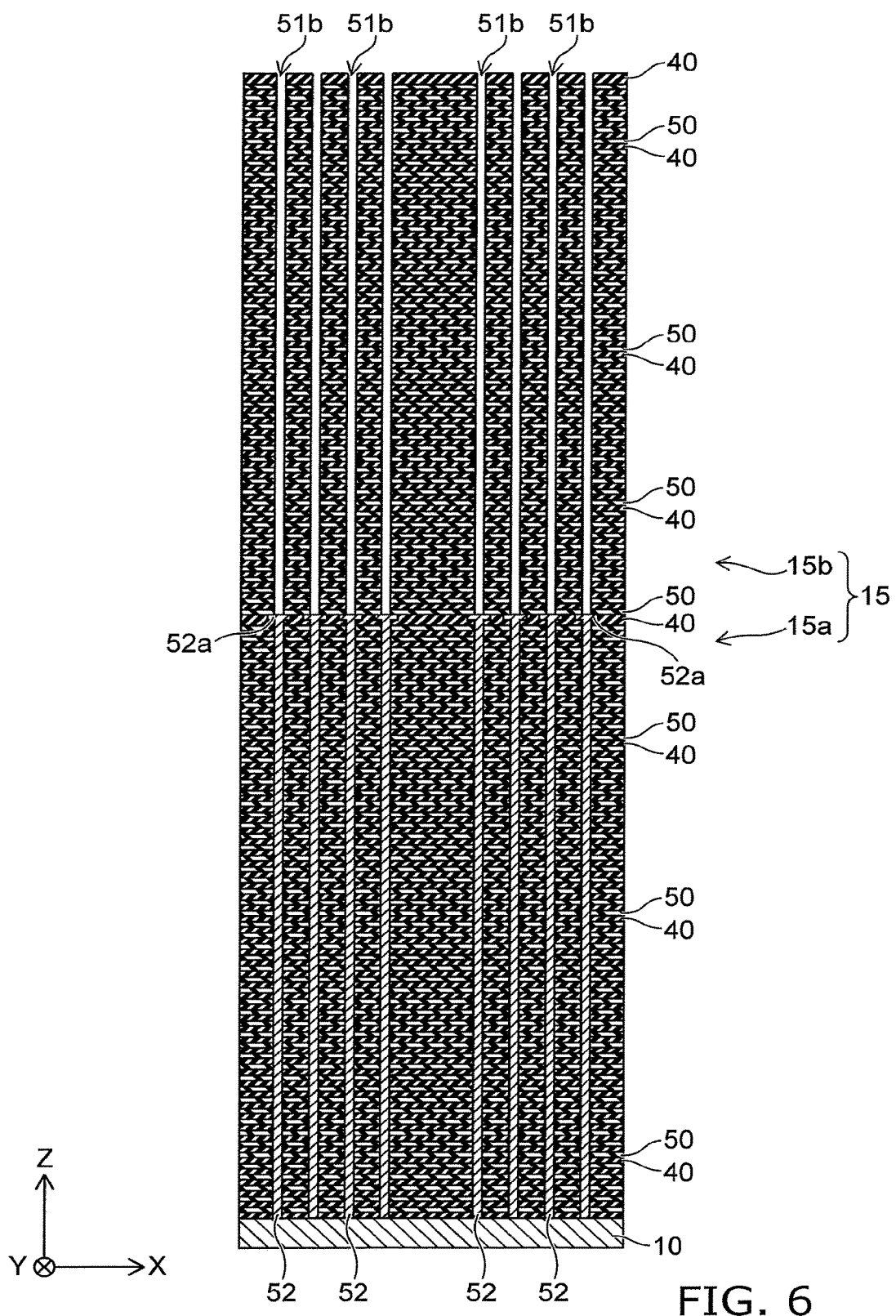

Then, as shown in FIG. 6, a plurality of through holes 51b is formed in the stacked body 15b by a photolithography process using a mask and an etching process such as RIE. In the formation of the through holes 51b, there is performed alignment using the alignment mark Ma described later. The through holes 51b each penetrate the stacked body 15b to reach the connection part 52a of the sacrificial film 52.

Figure 7:
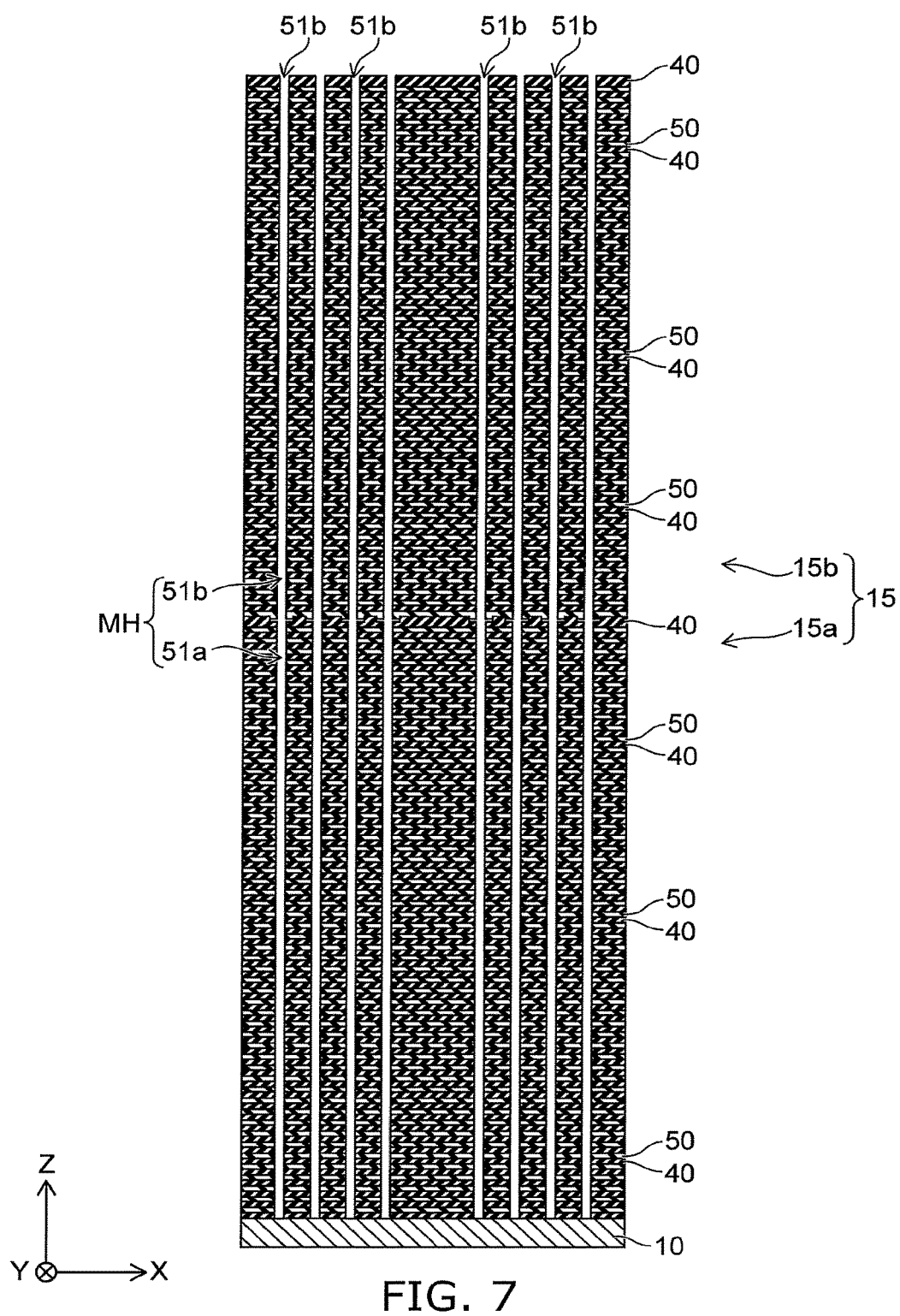

Then, as shown in FIG. 7, the sacrificial film 52 in each of the through holes 51a is removed via the through holes 51b. Due to the removal of the sacrificial films 52, the memory holes MH each including the through hole 51a and the through hole 51b are formed.

Then, as shown in FIG. 8, columnar sections CL are formed in the respective memory holes MH. The columnar sections CL each have a connection part CLa with the width of the upper part widened. The connection parts CLa are located in the insulating film 40 of the uppermost layer of the stacked body 15a.

For example, as shown in FIG. 9, using, for example, a CVD method, silicon oxide is deposited on the inner surface of each of the memory holes MH to form a block insulating film 23 silicon nitride is deposited to form a charge storage film 22, and silicon oxide is deposited to form the tunnel insulating film 21 in sequence. Subsequently, by performing RIE, the tunnel insulating film 21, the charge storage film 22, and the block insulating film 23 are removed from the bottom surface of each of the memory holes MH to thereby expose the substrate 10. Subsequently, silicon is deposited to form a channel 20, and then silicon oxide is deposited to form a core part 25. Thus, the columnar section CL is formed in each of the memory holes MH. The columnar sections CL each have the core part 25, the channel 20, the tunnel insulating film 21, the charge storage film 22 and the block insulating film 23. Further, the channels 20 have contact with the substrate 10.

Figure 10:
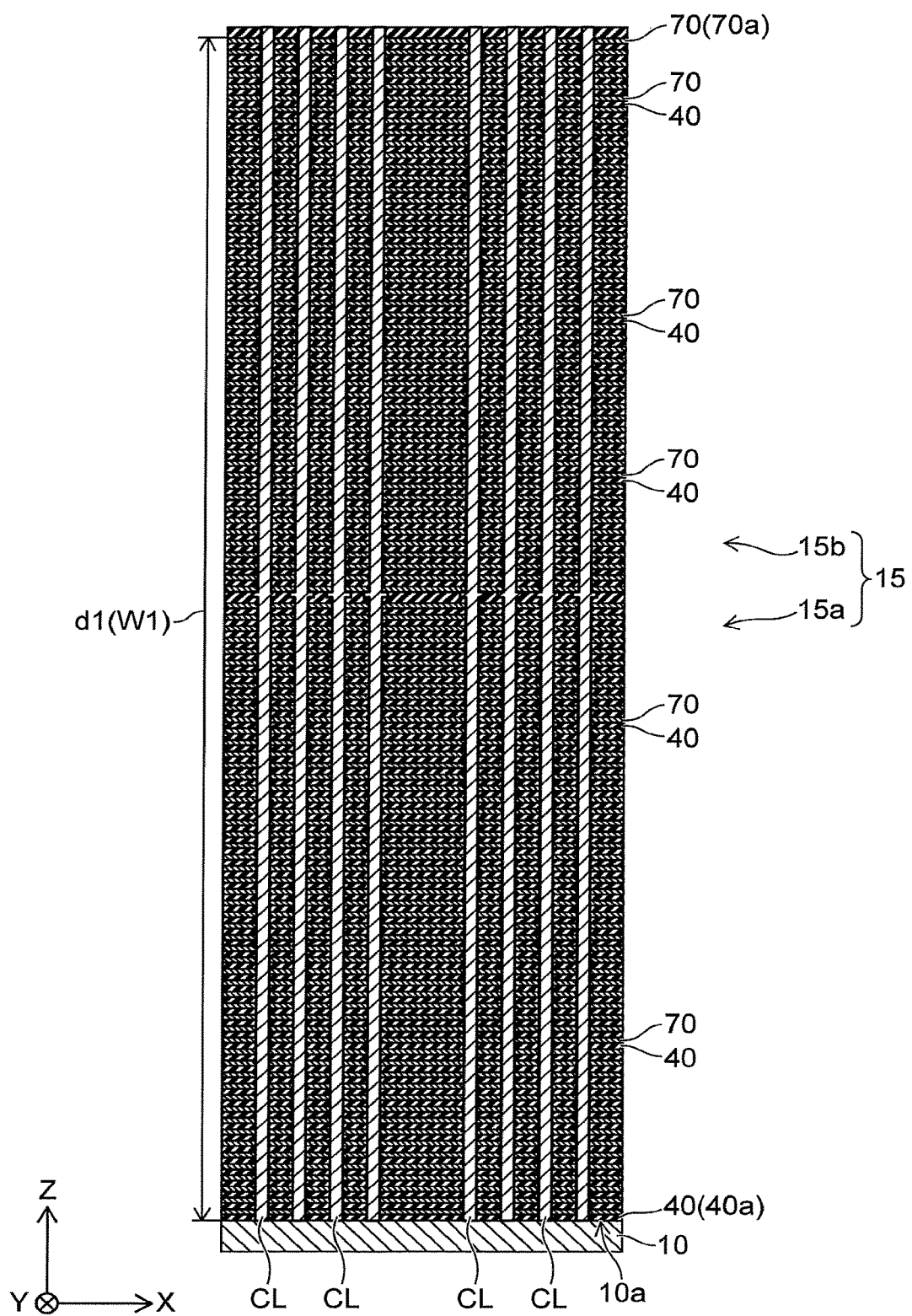
FIG. 10 to FIG. 18 are cross-sectional views showing a method for manufacturing the semiconductor memory device according to the first embodiment.

Then, as shown in FIG. 10, a plurality of slits (not shown) extending in the X-direction and the Z-direction is formed in the stacked body 15. By an etching process via the slits, the sacrificial films 50 are removed. Due to the removal of the sacrificial films 50, hollows are formed, and then, metal such as tungsten is deposited via the slits to fill in the hollows. Thus, the sacrificial films 50 are replaced with electrode films 70 in the stacked body 15. The electrode films 70 are each a word line, and each function as a control gate in the memory cell.

It should be noted that the second uppermost sacrificial film 50a of the stacked body 15 is replaced with the electrode film 70a of the uppermost layer out of the plurality of electrode films 70. Therefore, the electrode film 70a of the uppermost layer is located at the distance d1 in the Z-direction from the upper surface 10a of the substrate 10. Therefore, the distance d1 corresponds to the thickness W1 of a part from the insulating film 40a of the lowermost layer to the second uppermost electrode film 70a in the stacked body 15.

The semiconductor memory device 1 is manufactured in such a manner as described above.

Although the brief flow of the method of manufacturing the semiconductor memory device 1 is as described hereinabove, the alignment mark Ma is formed in advance in the scribing region Rs in the embodiment in order to form the through holes 51b right above the respective connection parts 52a of the sacrificial films 52 as in the process shown in FIG. 6. The formation of the alignment mark Ma will be described using FIG. 11 through FIG. 18.

FIG. 11 through FIG. 18 each show a cross-section of the area A in the scribing region Rs in FIG. 1. Further, the dotted lines shown in FIG. 11 through FIG. 18 represent the fact that the substrate 10 and the structure on the substrate 10 are laterally segmentalized due to the dicing line formed in the scribing region Rs.

Figure 11:
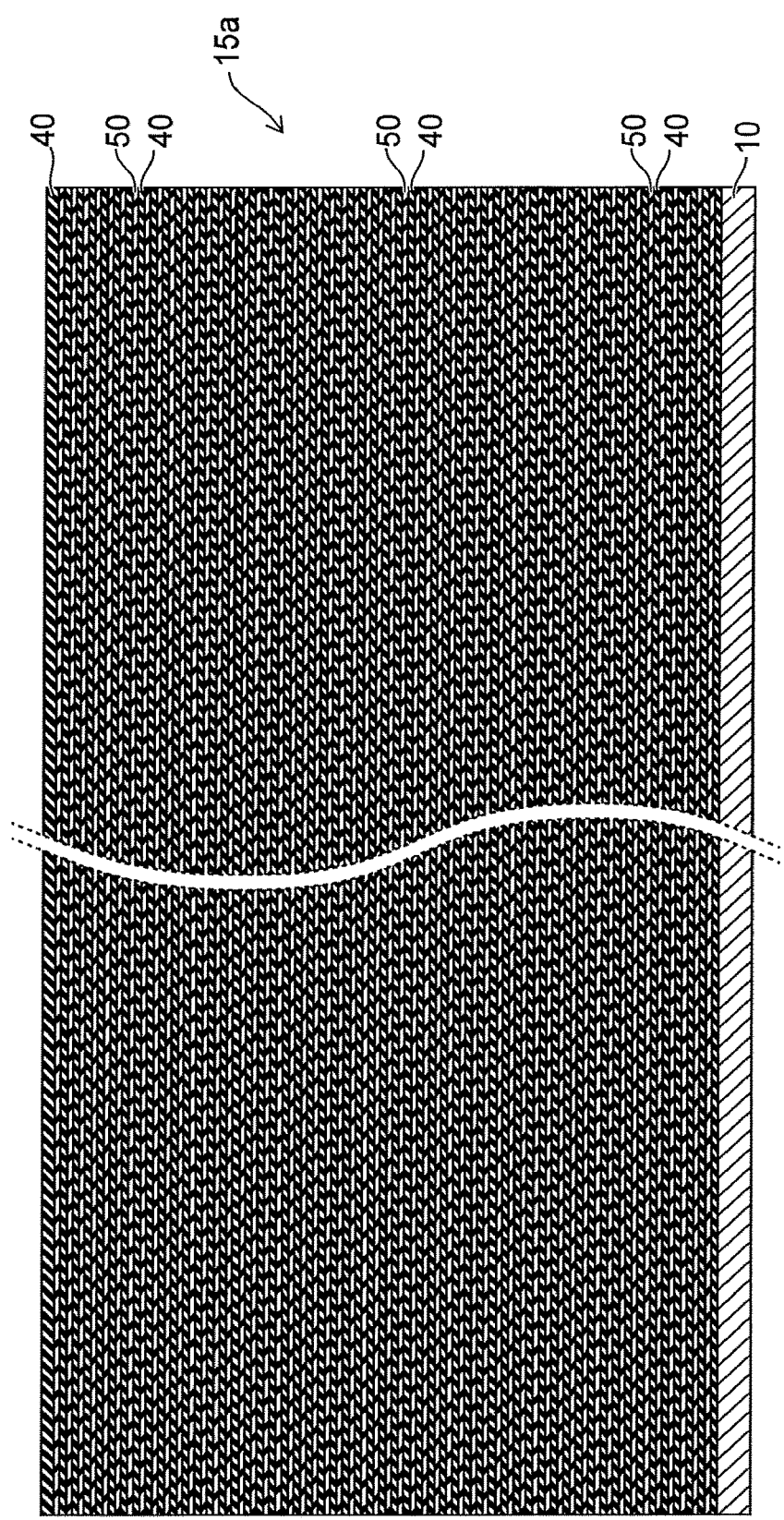

Firstly, as shown in FIG. 11, the insulating films 40 and the sacrificial films 50 are alternately stacked on one another to form the stacked body 15a. For example, formation of the stacked body 15a in the scribing region Rs is performed at the same time as the formation of the stacked body 15a in each of the cell regions Rc described in the process shown in FIG. 2.

Figure 12:
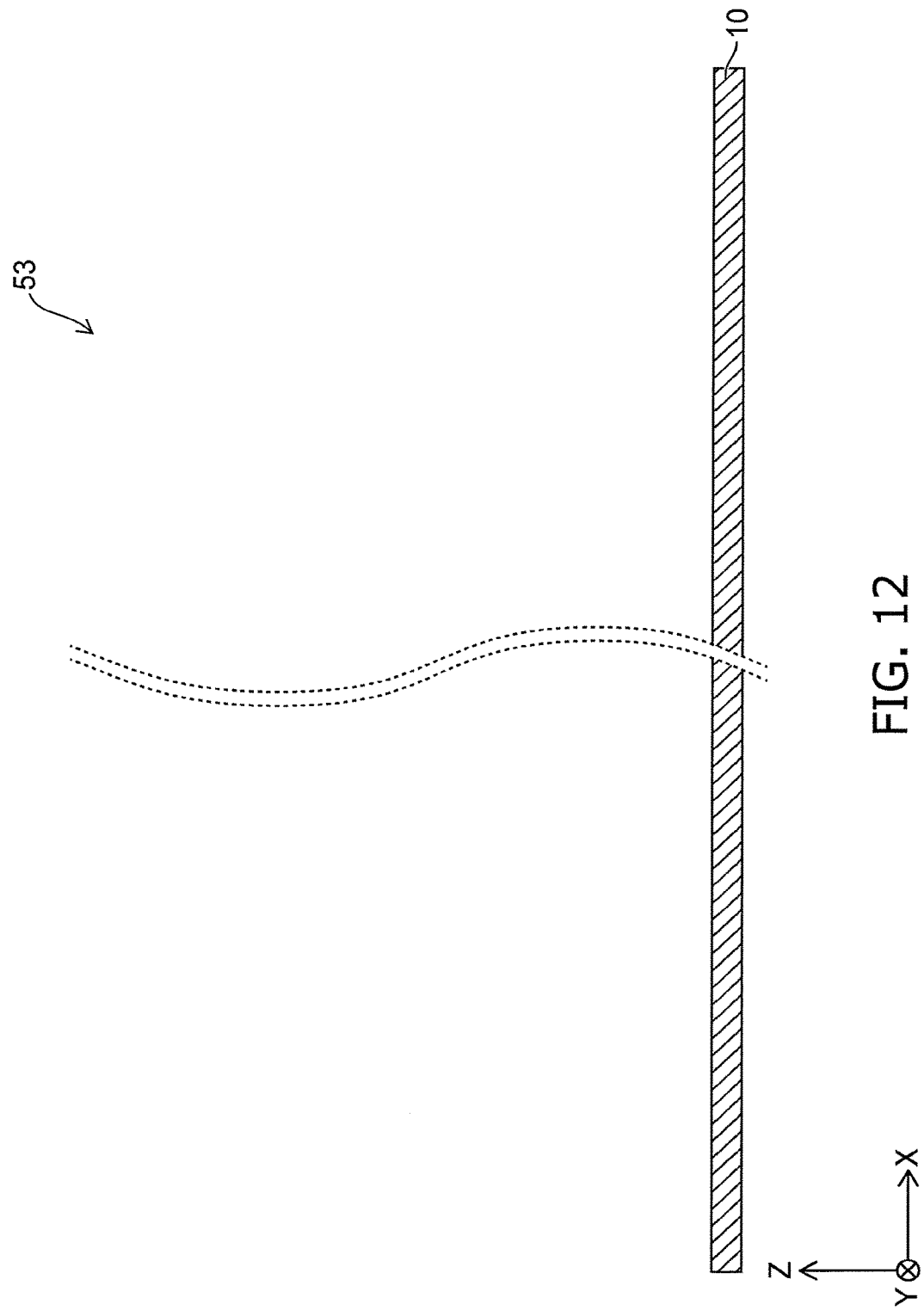

Then, as shown in FIG. 12, the stacked body 15a is removed by, for example, a photolithography process using a mask and an etching process such as RIE. For example, the removal of the stacked body 15a is performed at the same time as the process of processing an end part of the cell region Rc to have a stepped shape. The end part is processed so as to have the stepped shape without covering the scribing region Rs with the mask to thereby remove the stacked body 15a. Thus, a hollow 53 is formed on the substrate 10.

Figure 13:
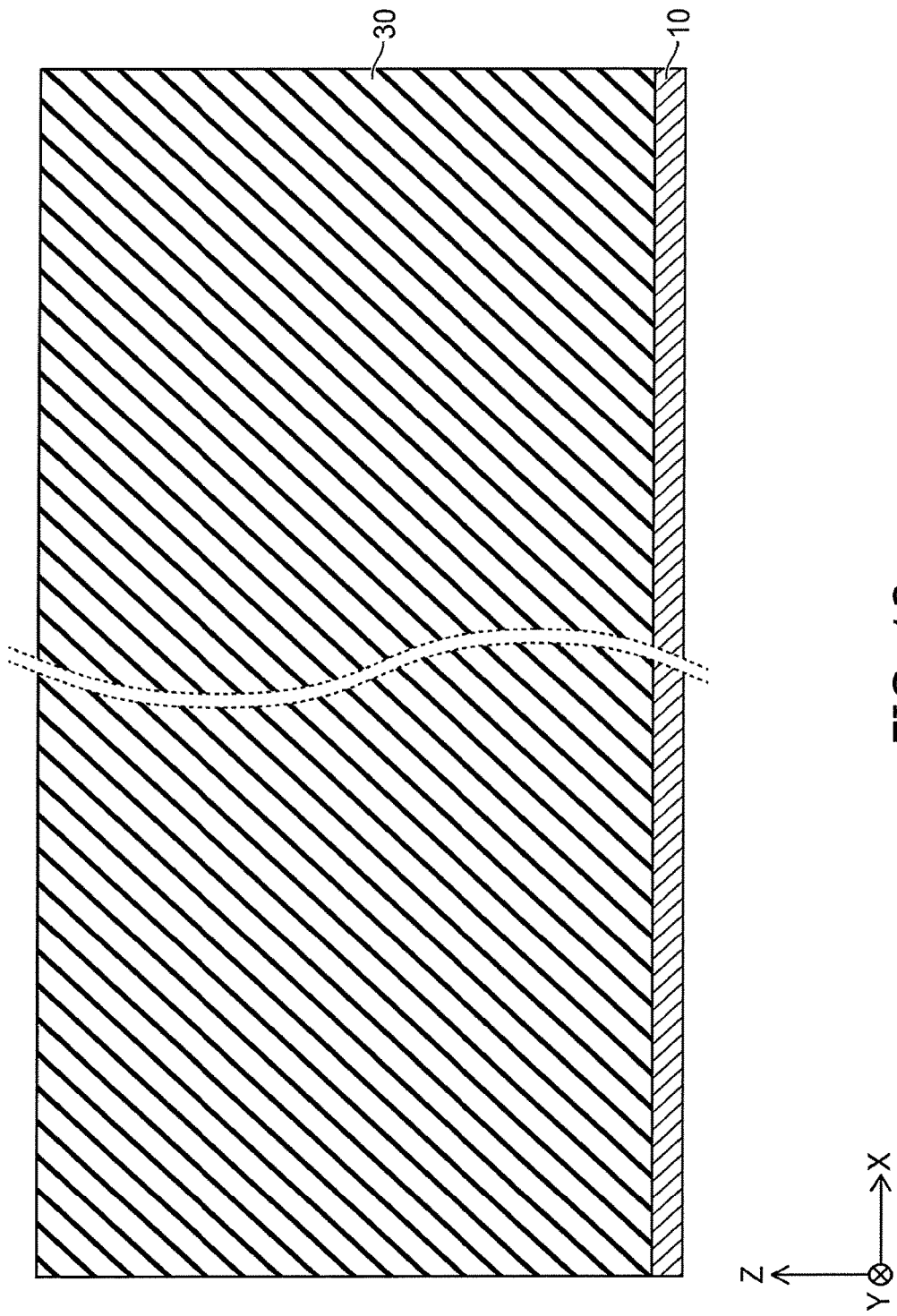

Then, as shown in FIG. 13, an insulating film 30 is formed in the hollow 53 using, for example, a CVD method. The insulating film 30 is formed of, for example, silicon oxide. The insulating film 30 is formed of, for example, TEOS (tetraethoxysilane). The insulating film 30 corresponds to the lower-stand part.

Figure 14:
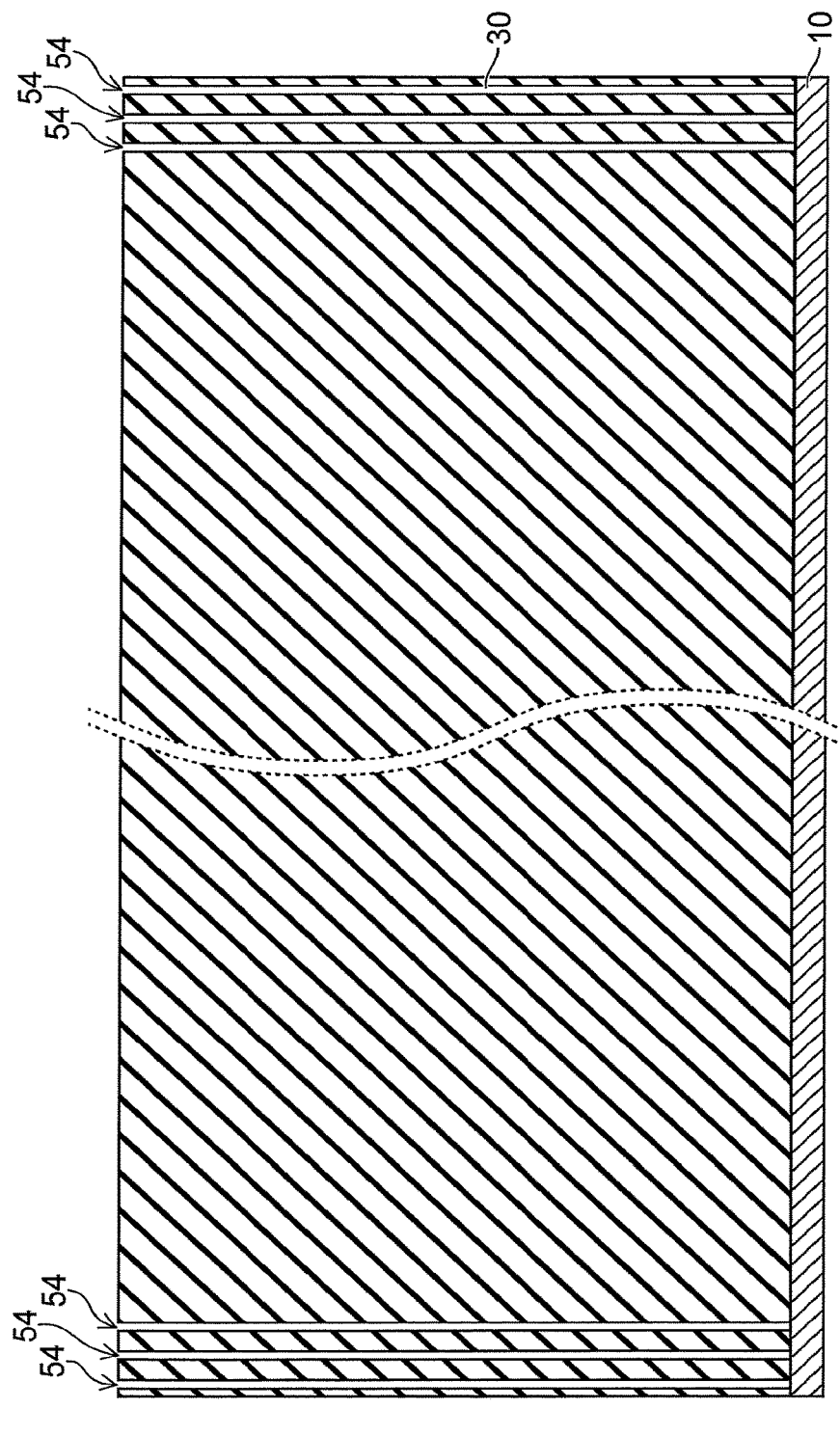

Then, as shown in FIG. 14, a plurality of through holes 54 is formed in the insulating film 30 by a photolithography process using a mask and an etching process such as RIE. For example, formation of the through holes 54 in the scribing region Rs is performed at the same time as the formation of the through holes 51a in each of the cell regions Rc described in the process shown in FIG. 3.

Figure 15:
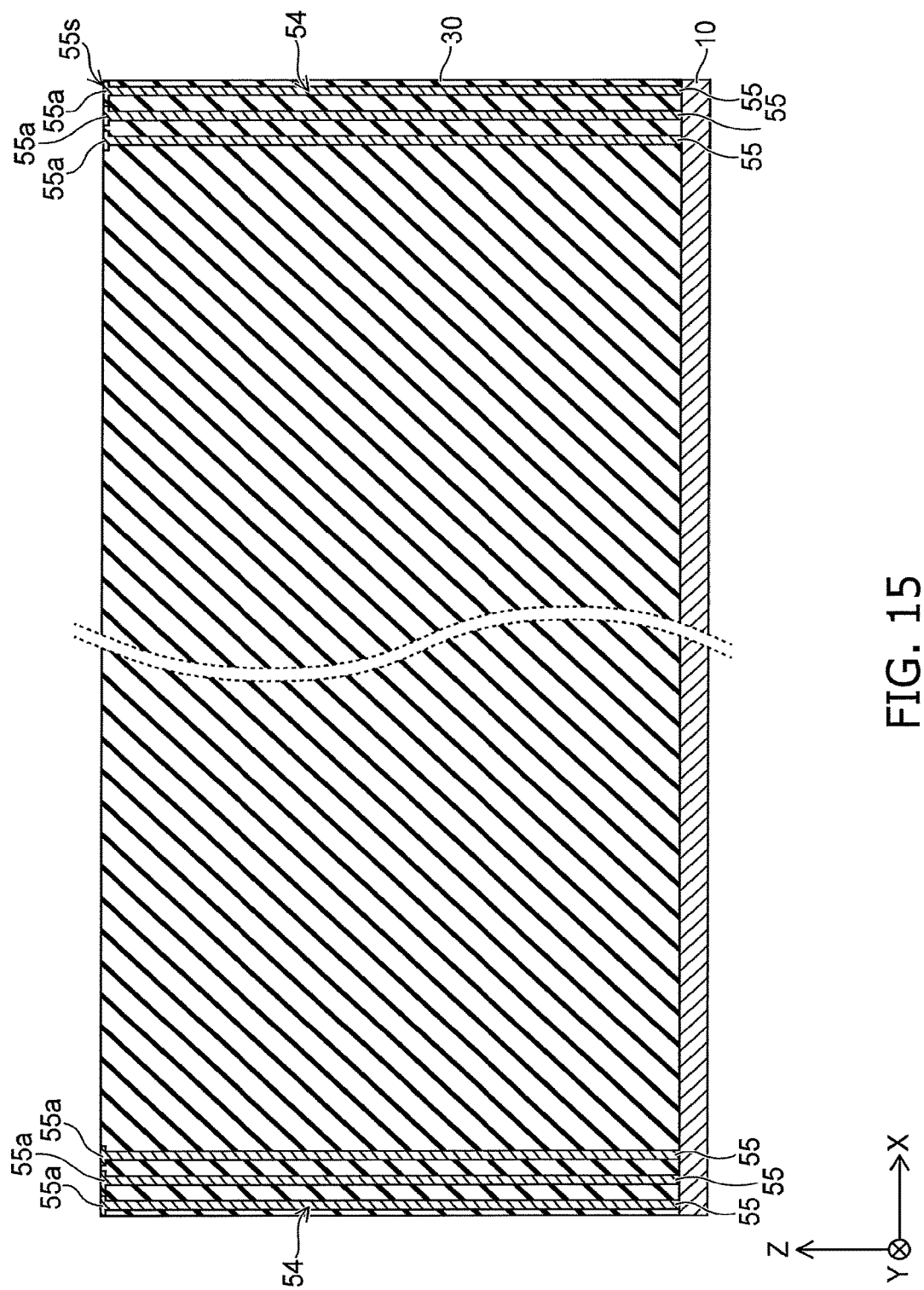

Then, as shown in FIG. 15, amorphous silicon or the like is deposited to form a sacrificial film 55 in each of the through holes 54. The sacrificial films 55 can also be formed of polysilicon obtained by crystallizing the amorphous silicon. The shape of each of the sacrificial films 55 is, for example, a columnar shape. Subsequently, the sacrificial film 55 located in an upper part of each of the through holes 54 is removed by an etching process such as RIE. Subsequently, by performing wet etching from the upper surface of each of the through holes 54, the insulating film 30 is partially removed. Thus, the width of the upper part of each of the through holes 54 is widened.

Subsequently, by depositing amorphous silicon or the like so as to fill the widened part in the upper part of each of the through holes 54, and then etching back the amorphous silicon or the like, the sacrificial film 55 is formed in the upper part of each of the through holes 54 once again. Since the width of the upper part of each of the through holes 54 is widened, the sacrificial films 55 each have a widened part 55a with the width of the upper part widened. For example, the formation of the sacrificial films 55 in the scribing region Rs is performed at the same time as the formation of the sacrificial films 52 in each of the cell regions Rc described in the process shown in FIG. 4. On this occasion, for example, the upper surface 55s of the widened part 55a of each of the sacrificial films 55 is located at the same plane as the upper surface 52s of the connection part 52a of each of the sacrificial films 52.

Figure 16:
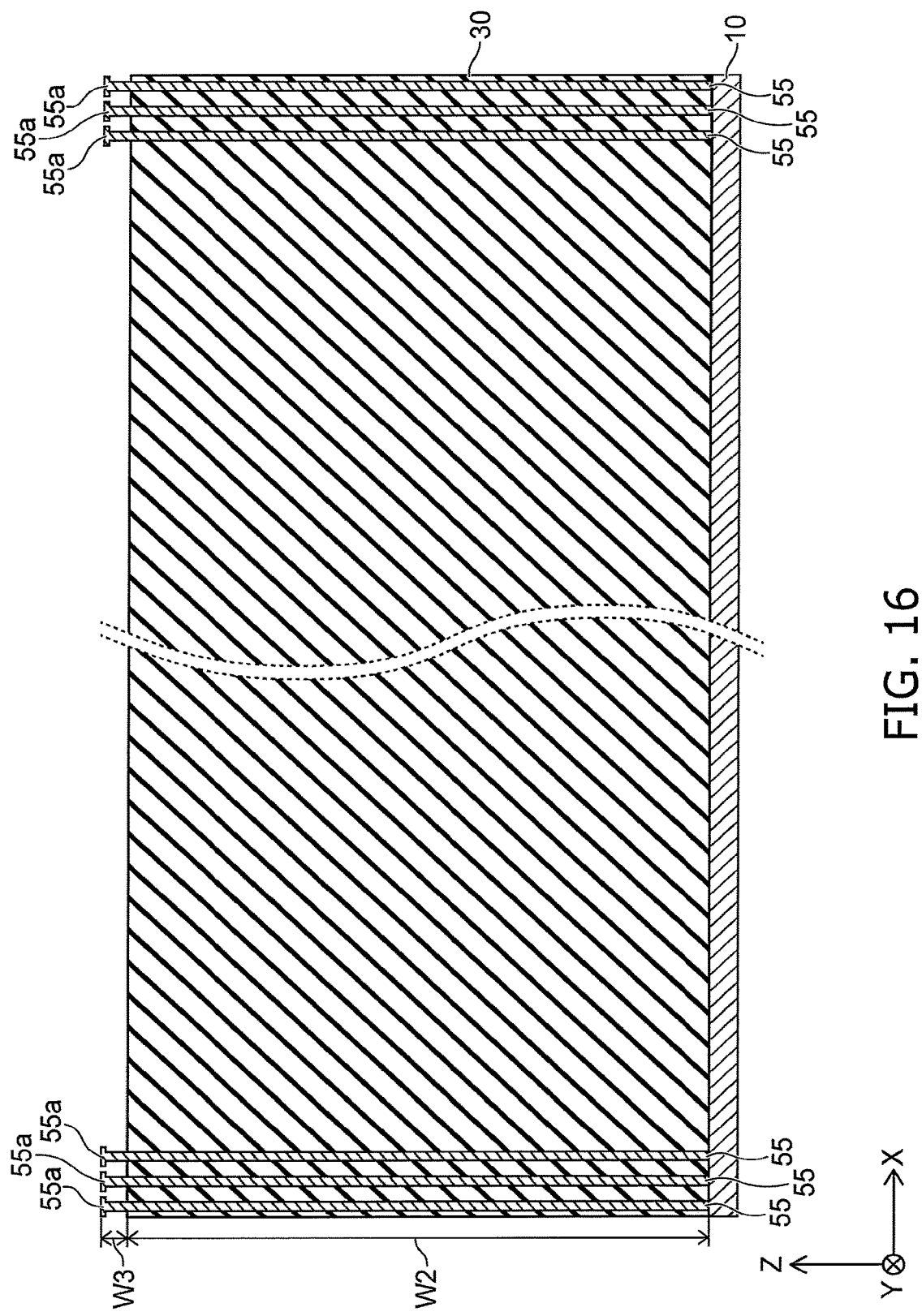

Then, as shown in FIG. 16, the insulating film 30 is etched back by performing wet etching. Thus, the insulating film 30 is partially removed to partially expose the sacrificial films 55 each including the widened part 55a from the insulating film 30. The insulating film 30 has the thickness W2 in the Z-direction. Further, the part exposed from the insulating film 30 in each of the sacrificial films 55 has the thickness W3 in the Z-direction.

Figure 17:
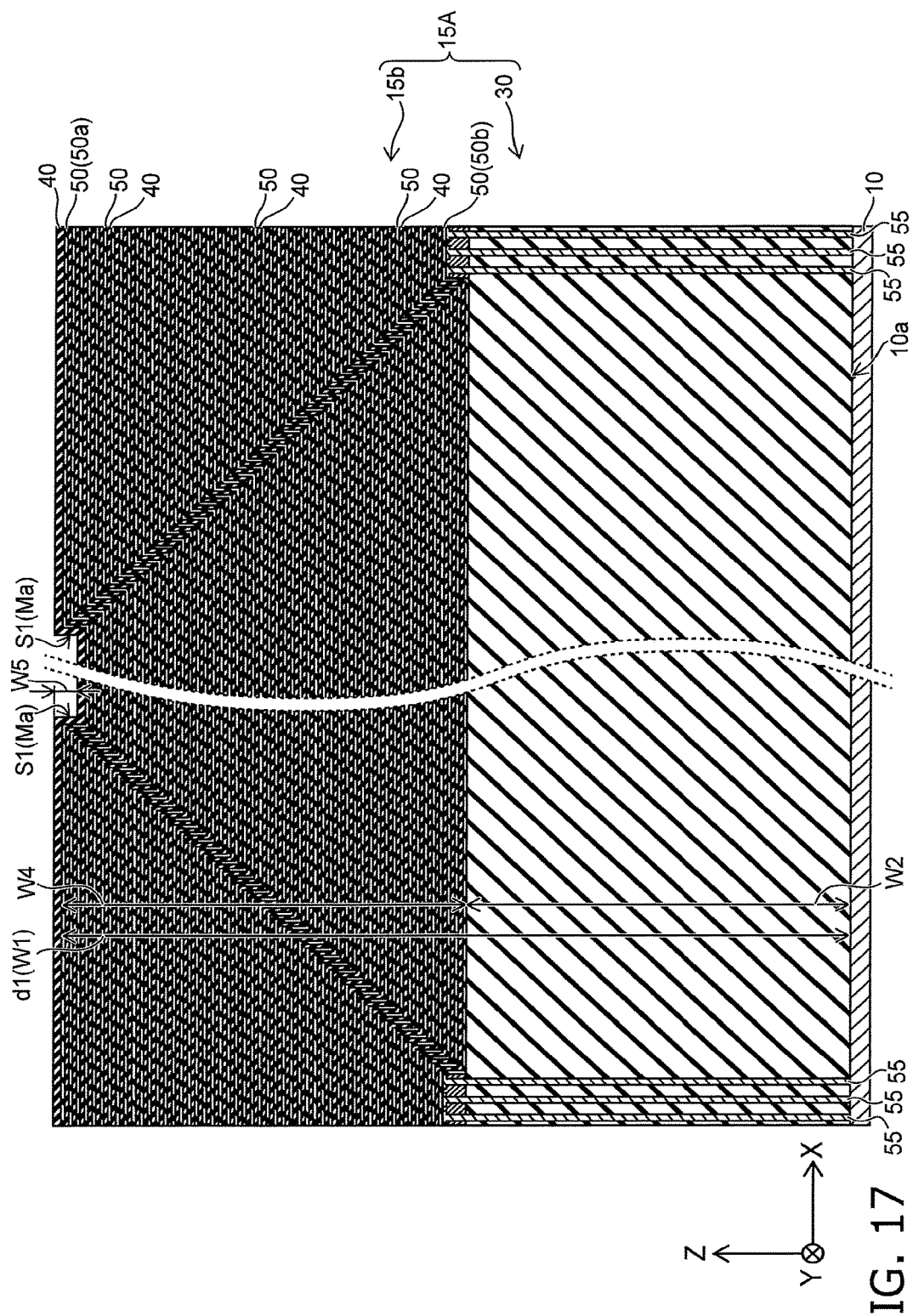

Then, as shown in FIG. 17, the sacrificial films 50 and the insulating films 40 are alternately stacked on one another along the Z-direction to form a stacked body 15b on the sacrificial films 55 thus exposed and the insulating film 30 using, for example, a CVD method. Thus, a stacked body 15A having the insulating film 30 and the stacked body 15b is formed. The insulating film 30 corresponds to a lower-stand part of the stacked body 15A, and the stacked body 15b corresponds to an upper-stand part of the stacked body 15A. It should be noted that a space between the parts exposed from the insulating film 30 in the sacrificial films 55 can be filled with the sacrificial film 50 and the insulating film 40 as indicated by hatching in FIG. 17, or can be provided with an air gap.

For example, formation of the stacked body 15b in the scribing region Rs is performed at the same time as the formation of the stacked body 15b in each of the cell regions Rc described in the process shown in FIG. 5. It should be noted that since the slit is not formed in the scribing region Rs, unlike the stacked body 15b in the cell region Rc, the sacrificial films 50 of the stacked body 15b in the scribing region Rs remain unreplaced with the electrode films 70.

The stacked body 15b has the thickness W4 in the Z-direction from the sacrificial film 50b of the lowermost layer to the second uppermost sacrificial film 50a. Further, the second uppermost sacrificial film 50a of the stacked body 15b is located at the distance d1 (the width W1) in the Z-direction from the upper surface 10a of the substrate 10. In the example shown in FIG. 17, the distance d1 (the thickness W1) corresponds to the sum of the thickness W2 of the insulating film 30 and the thickness W4 of a part of the stacked body 15b.

For example, the thickness W2 is the thickness not less than 30% of the distance d1 (the thickness W1). For example, the thickness W2 is not less than 2.5 micrometer and not more than 3.0 micrometer. For example, the thickness W4 is the thickness not less than 30% of the distance d1 (the thickness W1). For example, the thickness W4 is not less than 3.0 micrometer and not more than 3.5 micrometer.

Due to the formation of the sacrificial films 55 thus exposed, when forming the stacked body 15b, a step S1 is provided to the stacked body 15b. The step S1 is the alignment mark Ma. In the example shown in FIG. 17, the two steps S1 are formed since the sacrificial films 55 are formed on the both sides in the X-direction of the scribing region Rs. Due to such two steps S1, a recess is provided to the stacked body 15b. The width W5 of the step S1 is roughly equal to the thickness W3 in the Z-direction of the sacrificial films 55 thus exposed.

Figure 18:
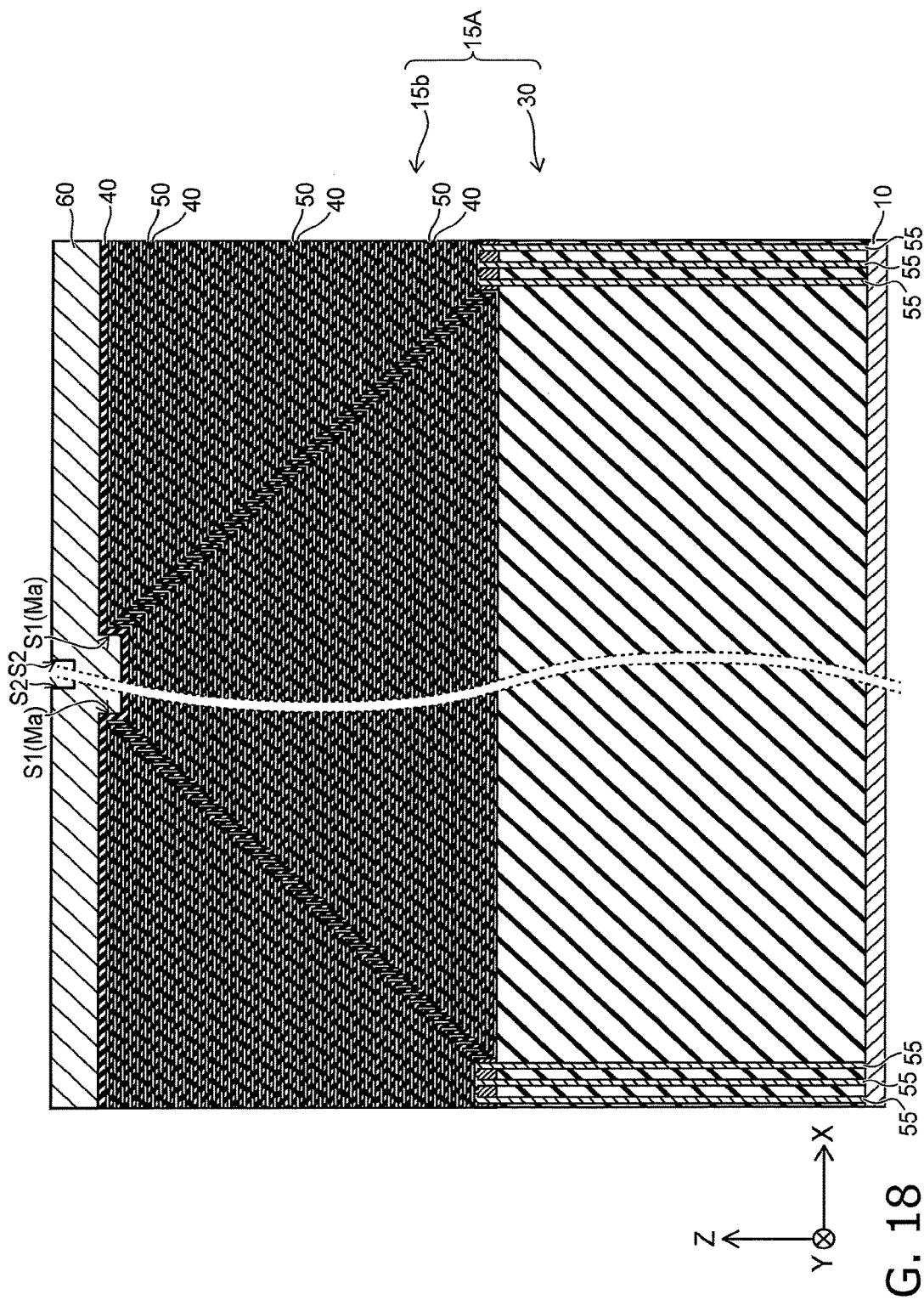

Then, as shown in FIG. 18, a mask 60 such as a hard mask is formed on the stacked body 15b. Since the step S1 is provided to the stacked body 15b, if the mask 60 is formed on the stacked body 15b, a step S2 is provided to the mask 60. In other words, the step S2 is provided to the mask 60 so that the step S1 is transferred. In the example shown in FIG. 18, the two steps S2 are formed, and due to such two steps S2, a recess is provided to the mask 60.

Subsequently, based on the steps S2 provided to the mask 60, the alignment for forming the through holes 51b is performed in the process shown in FIG. 6 described above. For example, the distance between the sacrificial films 55 and the step S1 is determined based on the step S1 (the step S2), and the alignment is achieved based on that distance and the distance between the sacrificial films 52 and the sacrificial films 55. Then, the through holes 51b are formed right above the respective connection parts 52a of the sacrificial films 52 by the photolithography method using the mask 60 and an etching process such as RIE.

Then, the advantages of the embodiment will be described.

In the semiconductor memory device 1 according to the embodiment, the stacked body 15b having the steps S1 as the alignment mark Ma is provided on the insulating film 30 in the scribing region Rs. Since such steps S1 are provided to the scribing region Rs, it is possible to suppress the displacement in forming the memory holes MH between the lower-stand part (the stacked body 15a) and the upper-stand part (the stacked body 15b) of the stacked body 15 in each of the cell regions Rc. Further, since the steps S1 (the steps S2) formed by processing the lower-stand part (the insulating film 30) of the stacked body 15A is read, even in the case in which the mask 60 is not formed of a light transmissive material, the displacement when forming the memory holes MH can be suppressed. Thus, the deterioration of the yield ratio due to the failure in electrical conduction due to the displacement between the memory holes MH is prevented. Therefore, it is possible to improve the productivity of the semiconductor memory device 1.

Further, when forming such steps S1, the insulating film 30 is partially removed to widen the width of the upper part of each of the through holes 54 by performing the wet etching as shown in FIG. 15, and the insulating film 30 is further partially removed to partially expose the sacrificial films 55 in the respective through holes 54 by performing the wet etching as shown in FIG. 16.

In contrast, for example, in the scribing region Rs, in the case in which both of the lower-stand part and the upper-stand part are formed by alternately stacking the silicon oxide films and the silicon nitride films on one another, and the step is provided to the upper-stand part as the alignment mark for forming the memory holes MH, the lower-stand part is processed by performing the etching process such as RIE. Specifically, since the silicon oxide films and the silicon nitride films are stacked on one another in the lower-stand part, in order to form the step, the lower-stand part is partially removed to widen the width of the upper part of each of the through holes to form the sacrificial films, and then dry etching is performed to further partially remove the lower-stand part to partially expose the sacrificial films in each of the through holes. Therefore, in the case of processing the lower-stand part having the silicon oxide films and the silicon nitride films stacked on one another, there is a possibility that the manufacturing cost rises since the dry etching is used in the etching process.

In the embodiment, since the lower-stand part of the scribing region Rs is formed of the insulating film 30 such as a silicon oxide film, the wet etching can be used in processing the lower-stand part. Thus, it is possible to reduce the cost in the process to thereby reduce the manufacturing cost compared to the case of processing the silicon oxide film and the silicon nitride film using the dry etching.

Second Embodiment

FIG. 19 through FIG. 24 are cross-sectional views showing a method of manufacturing the semiconductor memory device according to a second embodiment.

FIG. 19 through FIG. 24 each show a cross-section of the area A in the scribing region Rs in FIG. 1.

In the semiconductor memory device 2 according to the embodiment, there is provided a stacked body 15a instead of the insulating film 30. The other constituents are the same as those of the first embodiment, and therefore, the detailed description of the other constituents will be omitted.

In the present embodiment, the alignment mark Ma is formed in advance in the scribing region Rs in order to form the through holes 51b right above the respective connection parts 52a of the sacrificial films 52 as in the process shown in FIG. 6. The formation of the alignment mark Ma will be described using FIG. 19 through FIG. 24. The dotted lines shown in FIG. 19 through FIG. 24 represent the fact that the substrate 10 and the structure on the substrate 10 are laterally segmentalized due to the dicing line formed in the scribing region Rs.

Figure 19:
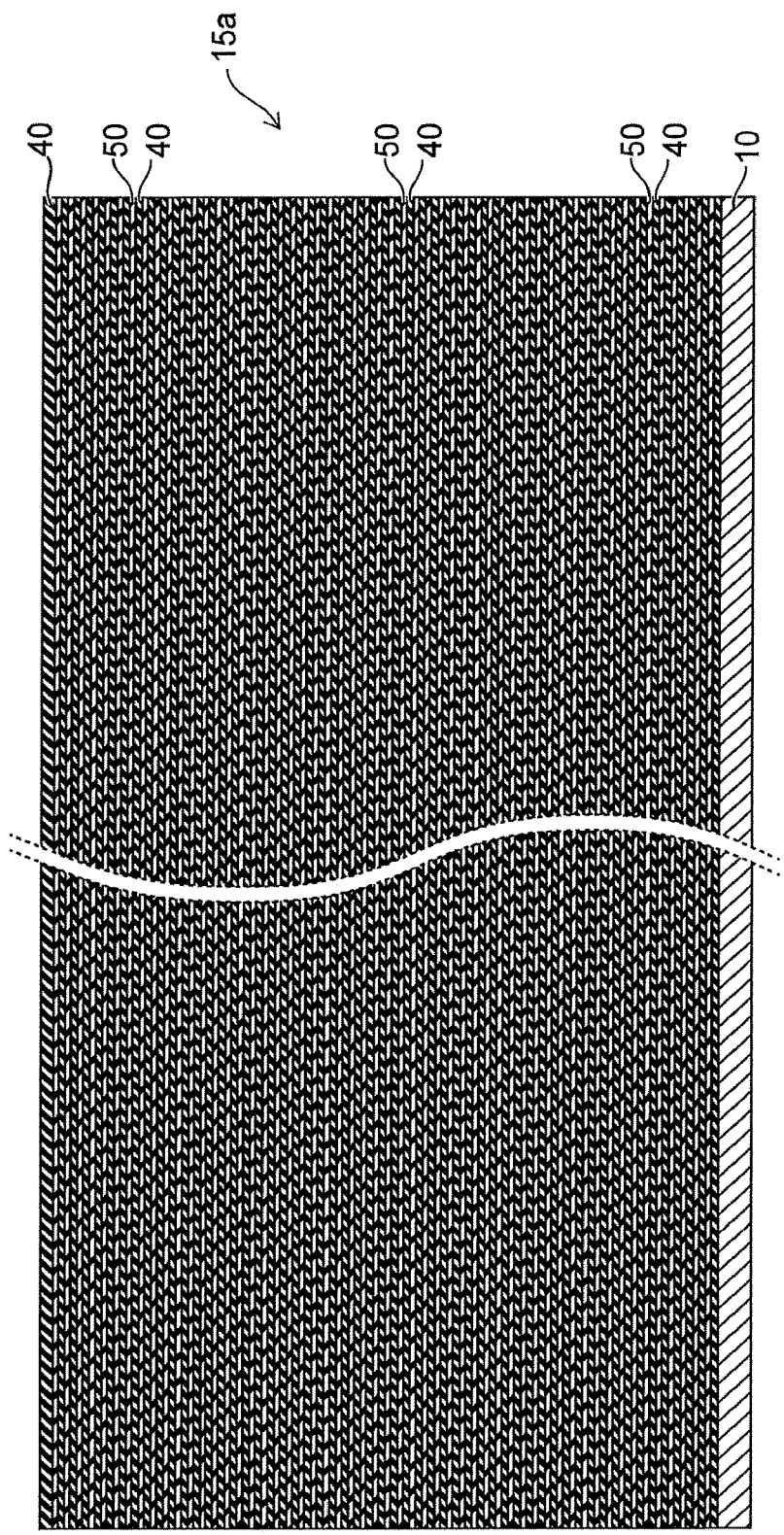
FIG. 19 to FIG. 24 are cross-sectional views showing a method for manufacturing a semiconductor memory device according to a second embodiment.

Firstly, as shown in FIG. 19, the insulating films 40 and the sacrificial films 50 are alternately stacked on one another to form the stacked body 15a.

Figure 20:
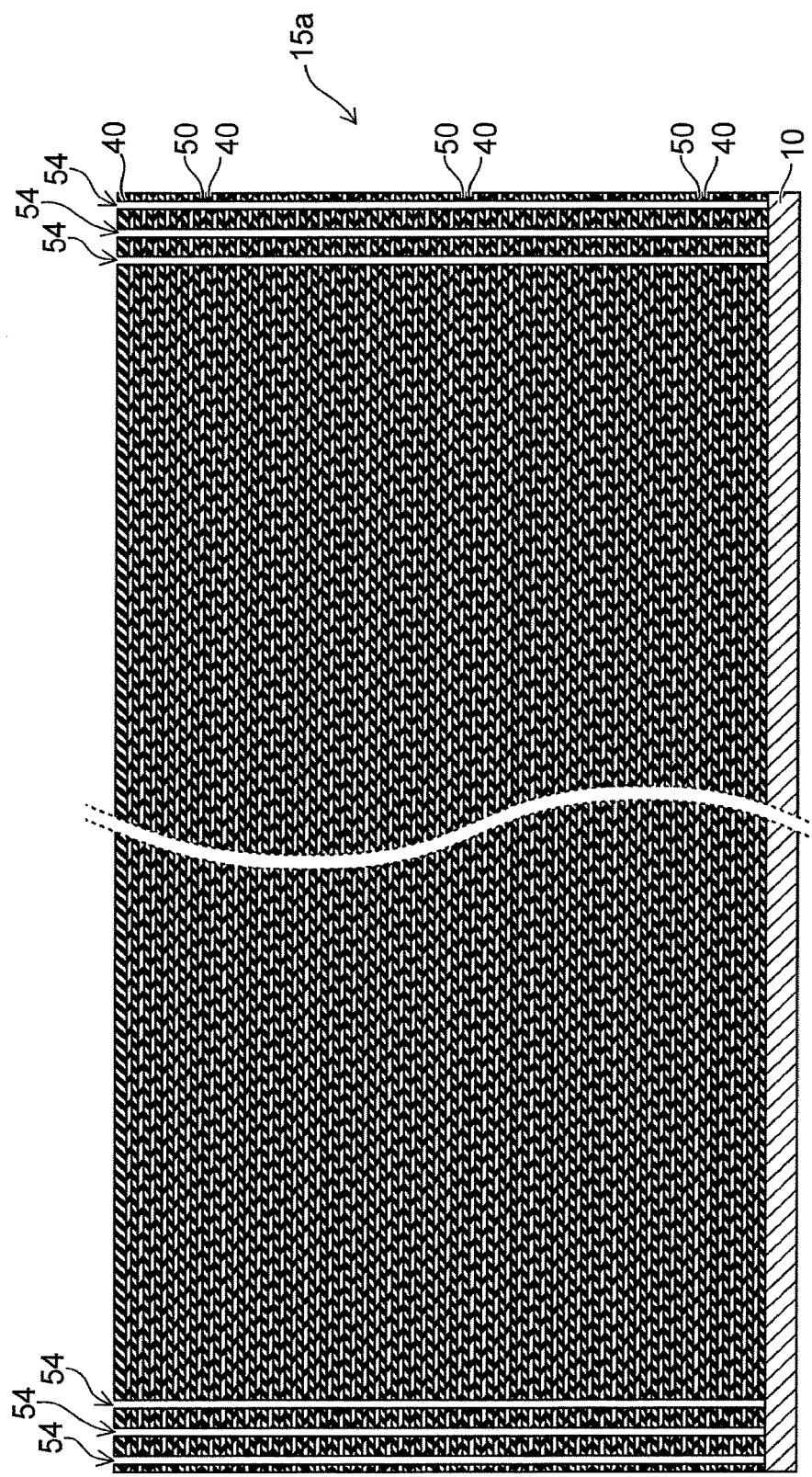

Then, as shown in FIG. 20, a plurality of through holes 54 is formed in the stacked body 15a by a photolithography process using a mask and an etching process such as RIE.

Figure 21:
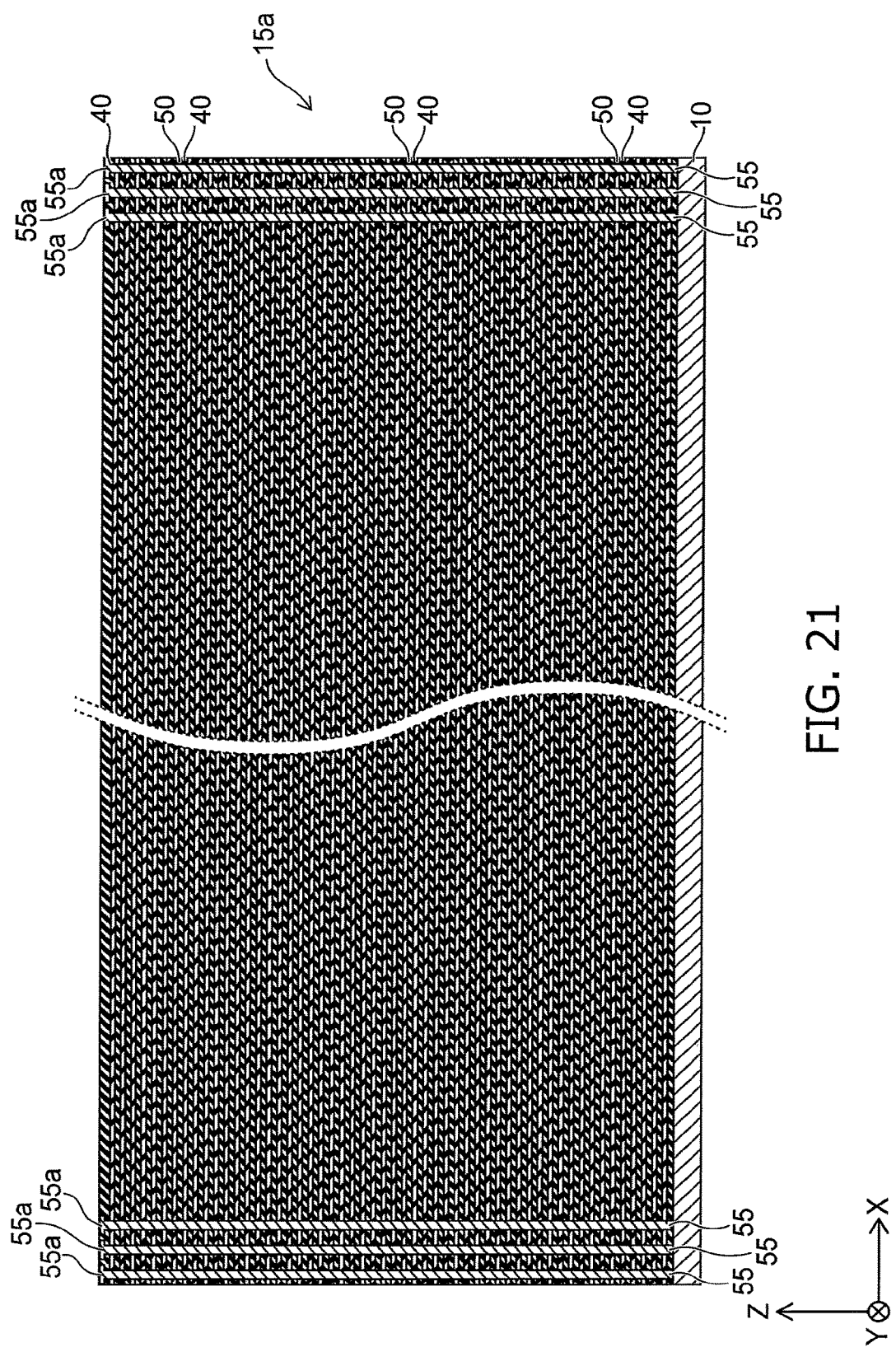

Then, as shown in FIG. 21, the sacrificial film 55 is formed in each of the through holes 54, and then the sacrificial film 55 located in an upper part of the through hole 54 is removed. Subsequently, the insulating film 40 of the uppermost layer of the stacked body 15a is partially removed. Subsequently, the sacrificial film 55 is formed in the widened part in the upper part of each of the through holes 54 once again. Since the width of the upper part of each of the through holes 54 is widened, the sacrificial films 55 each have the widened part 55a with the width of the upper part widened.

Figure 22:
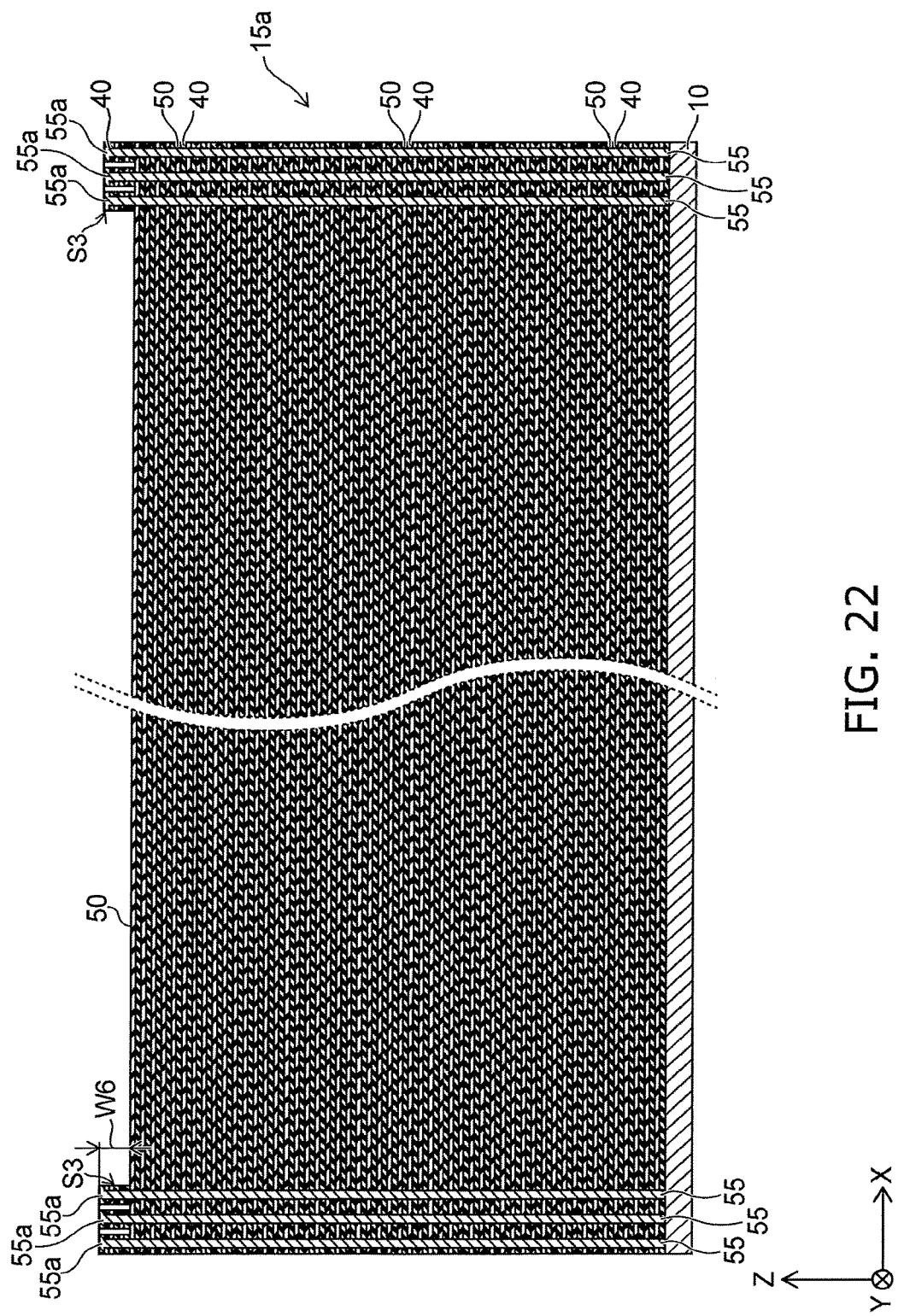

Then, as shown in FIG. 22, the stacked body 15a is partially removed from the upper surface using an etching process such as RIE. Thus, the sacrificial films 50 are partially exposed so that a part of the stacked body 15a provided with the sacrificial films 55 remains. Since the stacked body 15a is partially removed, steps S3 having the width W6 are provided to the stacked body 15a.

Figure 23:
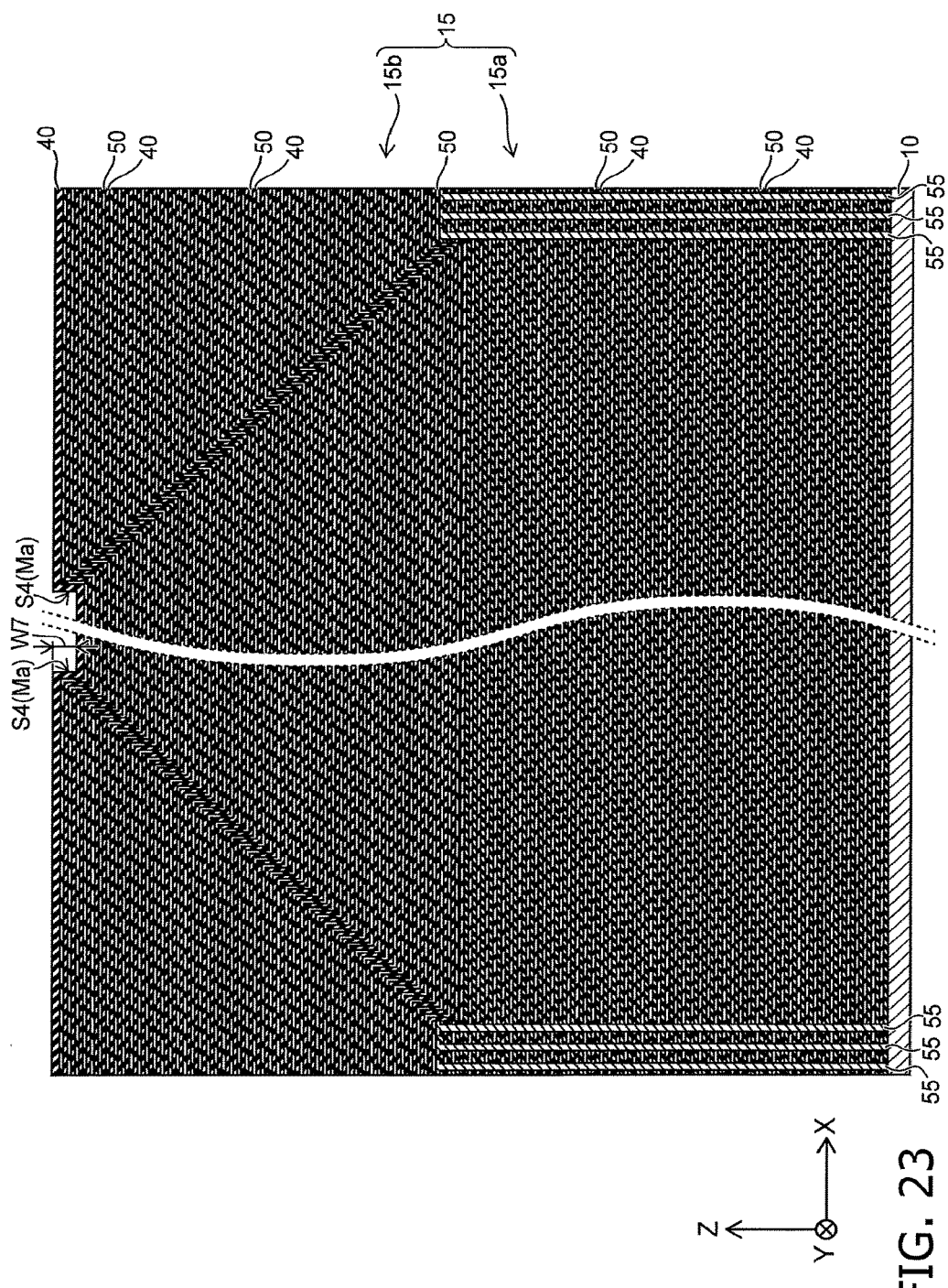

Then, as shown in FIG. 23, the sacrificial films 50 and the insulating films 40 are alternately stacked on one another along the Z-direction to form the stacked body 15b on the sacrificial film 50 thus exposed and the sacrificial films 55 so as to cover the steps S3. Thus, the stacked body 15 having the stacked body 15a and the stacked body 15b is formed. The stacked body 15a corresponds to a lower-stand part of the stacked body 15, and the stacked body 15b corresponds to an upper-stand part of the stacked body 15.

Since the steps S3 are provided to the stacked body 15a, if the stacked body 15b is formed, steps S4 are provided to the stacked body 15b. The step S4 is the alignment mark Ma. In the example shown in FIG. 23, the two steps S4 are formed since the steps S3 are formed on the both sides in the X-direction of the scribing region Rs. The width W7 of the step S4 is roughly equal to the width W6 of the step S3.

Figure 24:
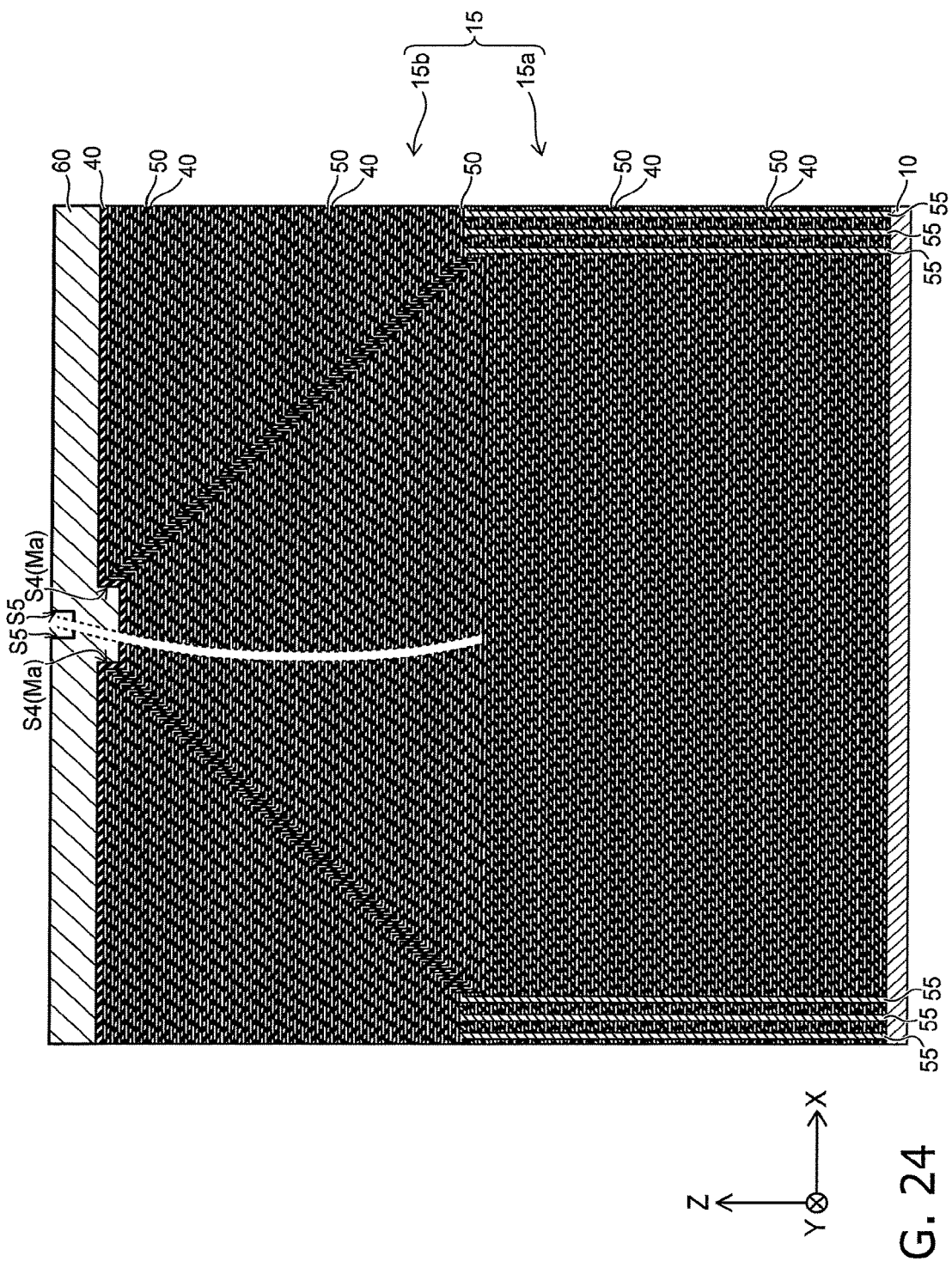

Then, as shown in FIG. 24, a mask 60 such as a hard mask is formed on the stacked body 15b. Since the steps S4 are provided to the stacked body 15b, if the mask 60 is formed on the stacked body 15b, steps S5 are provided to the mask 60. Subsequently, based on the steps S5 provided to the mask 60, the alignment for forming the through holes 51b is performed in the process shown in FIG. 6 described above.

Then, the advantages of the embodiment will be described.

In the semiconductor memory device 2 according to the embodiment, the stacked body 15b having the steps S4 as the alignment mark Ma is provided on the stacked body 15a in the scribing region Rs. Since such steps S4 are provided to the scribing region Rs, it is possible to suppress the displacement in forming the memory holes MH between the lower-stand part (the stacked body 15a) and the upper-stand part (the stacked body 15b) of the stacked body 15 in each of the cell regions Rc. Further, since the steps S4 (the steps S5) formed by processing the lower-stand part (the stacked body 15a) of the stacked body 15 is read, even in the case in which the mask 60 is not formed of a light transmissive material, the displacement when forming the memory holes MH can be suppressed. Thus, the deterioration of the yield ratio due to the failure in electrical conduction due to the displacement between the memory holes MH is prevented. Therefore, it is possible to improve the productivity of the semiconductor memory device 2.

Third Embodiment

Figure 25:
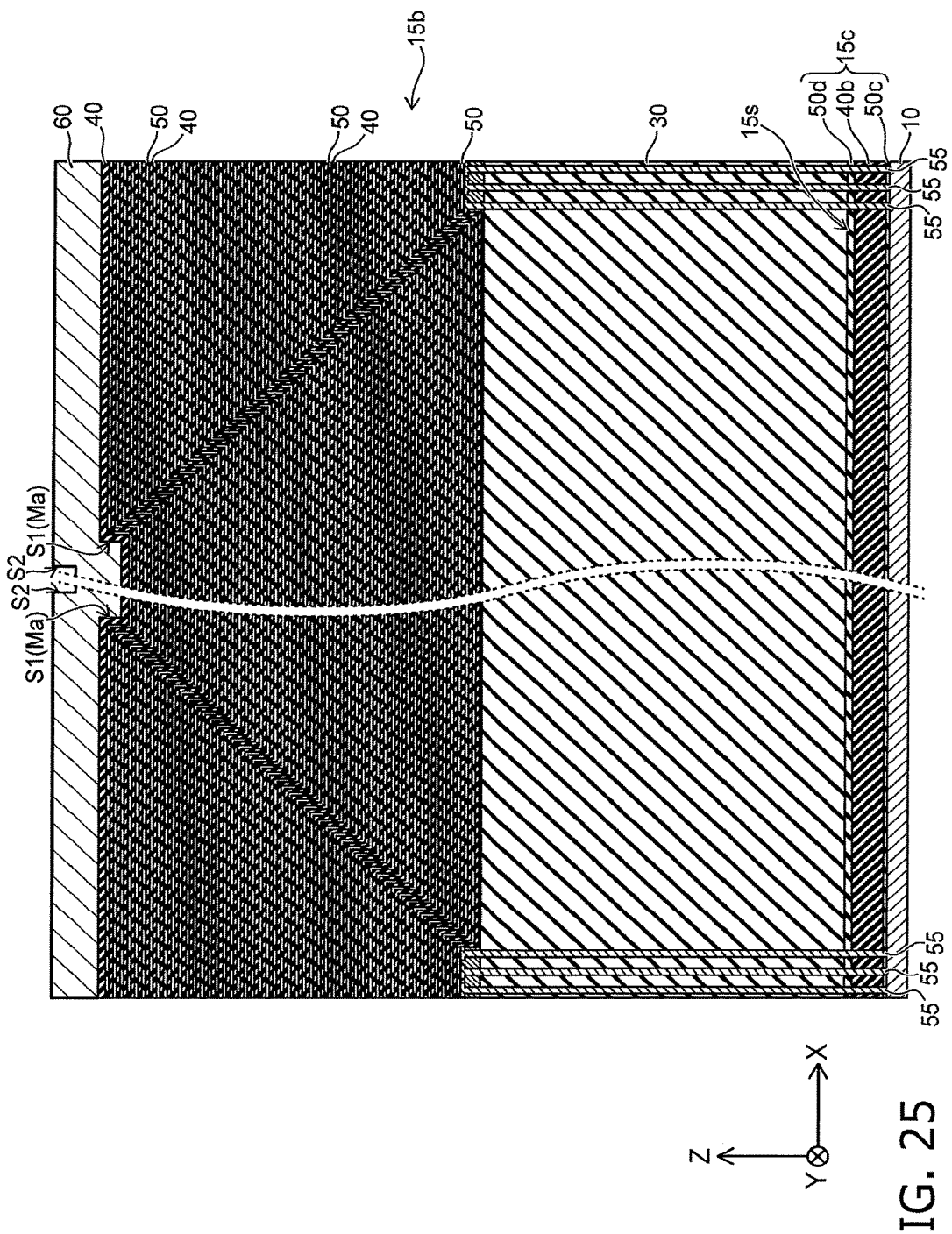
FIG. 25 is a cross-sectional view showing a method for manufacturing a semiconductor memory device according to a third embodiment.

FIG. 25 is a cross-sectional view showing a method of manufacturing a semiconductor memory device according to a third embodiment.

FIG. 25 shows a cross-section of the area A in the scribing region Rs in FIG. 1, and the cross-sectional view shown in FIG. 25 corresponds to the cross-sectional view shown in FIG. 18.

In the semiconductor memory device 3 according to the embodiment, there is provided a stacked body 15c. The other constituents than the stacked body 15c are the same as those of the first embodiment, and therefore, the detailed description of the other constituents will be omitted.

As shown in FIG. 25, in the scribing region Rs, there is provided the stacked body 15c. The stacked body 15c is located between the substrate 10 and the insulating film 30. The stacked body 15c has sacrificial films 50c, 50d and an insulating film 40b. The sacrificial film 50c, the insulating film 40b and the sacrificial film 50d are located in sequence on the substrate 10. The upper surface 15s (the upper surface of the sacrificial film 50d) of the stacked body 15c is located on the same plane as, for example, the upper surface of the interconnection layer of the peripheral circuits in each of the peripheral regions Rp. In this case, the interconnection layer of the peripheral circuits is, for example, a gate interconnection layer of a switching element.

The stacked body 15c having the sacrificial film 50c, the insulating film 40b and the sacrificial film 50d is formed as a substitute of the stacked body 15a in the process shown in FIG. 11 and FIG. 12. After forming the stacked body 15c on the substrate 10, the insulating film 30 is formed on the stacked body 15c. For example, the insulating film 30 is formed on the stacked body 15c so that the sum of the thickness in the Z-direction of the stacked body 15c and the thickness in the Z-direction of the insulating film 30 becomes roughly equal to the thickness W2 of the insulating film 30 in the process shown in FIG. 17. It should be noted that in the embodiment, the process shown in FIG. 14 and the following drawings is the same as in the first embodiment.

The advantages of the embodiment are substantially the same as those of the first embodiment described above.

Fourth Embodiment

Figure 26:
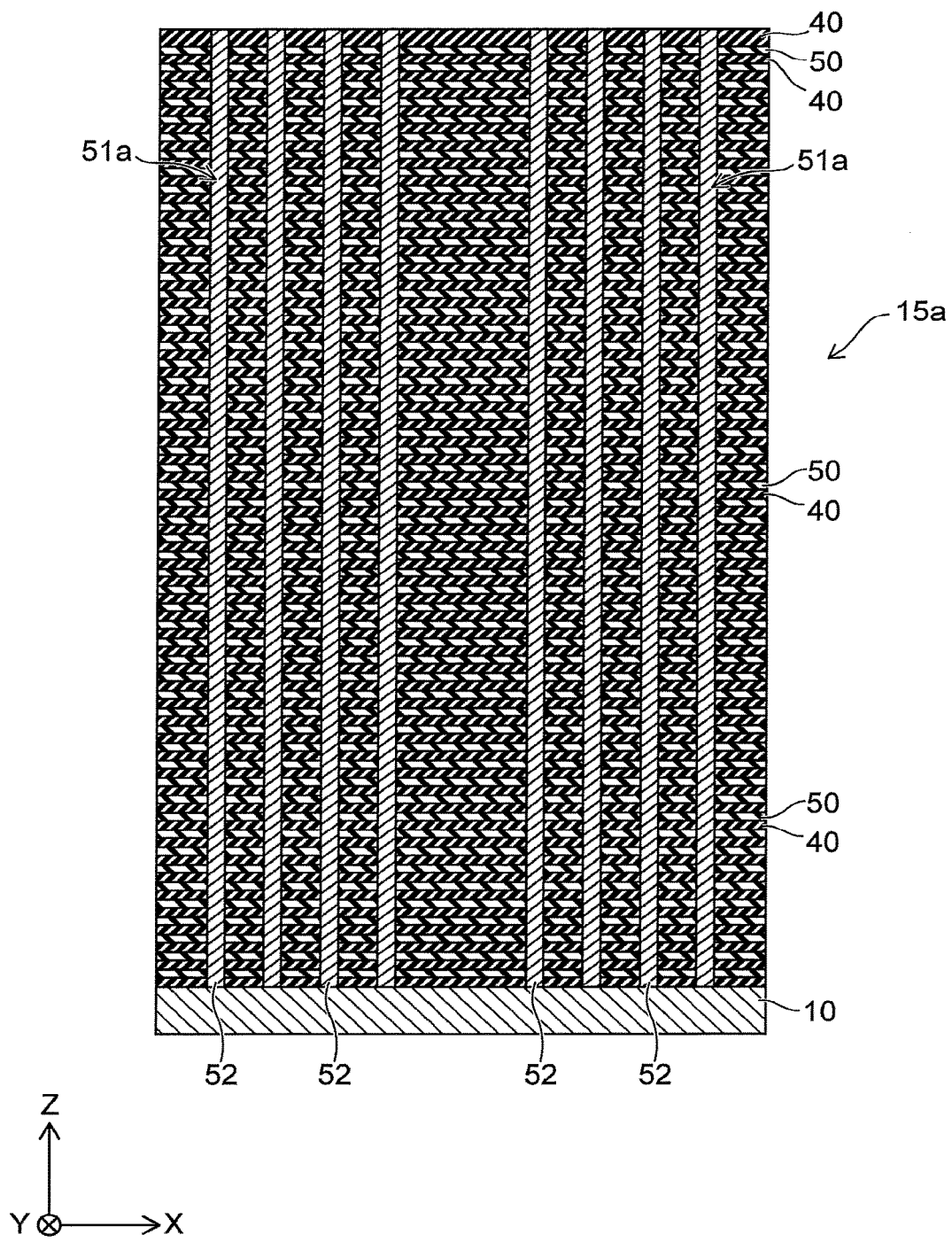
FIG. 26 is a cross-sectional view showing a method for manufacturing a semiconductor memory device according to a fourth embodiment.

FIG. 26 is a cross-sectional view showing a method of manufacturing a semiconductor memory device according to a fourth embodiment.

The cross-sectional view shown in FIG. 26 corresponds to the cross-sectional view shown in FIG. 4.

In the semiconductor memory device 4 according to the embodiment, the connection parts 52a are not provided. The other constituents are the same as those of the first embodiment, and therefore, the detailed description will be omitted.

As shown in FIG. 26, the process of forming the connection parts 52a is omitted in the process shown in FIG. 4. Specifically, after forming the plurality of through holes 51a in the stacked body 15a as shown in FIG. 3, the amorphous silicon or the like is deposited in each of the through holes 51a to form the sacrificial films 52 as shown in FIG. 26.

Subsequently, the process shown in FIG. 5 through FIG. 10 is performed.

It should be noted that in the case in which the formation of the through holes 54 and the sacrificial films 55 in the scribing region Rs is performed at the same time as the formation of the through holes 51a and the sacrificial films 52 in each of the cell regions Rc, for example, the widened parts 55a are not formed. Specifically, after forming the plurality of through holes 54 in the insulating film 30 as shown in FIG. 14, the amorphous silicon or the like is deposited in each of the through holes 54 to form the sacrificial films 55.

Subsequently, the process shown in FIG. 16 through FIG. 18 is performed.

The advantages of the embodiment are substantially the same as those of the first embodiment described above.

According to the embodiments described hereinabove, it is possible to realize the semiconductor memory device improved in productivity to reduce the manufacturing cost.

As described above, as an example, there is described the case in which the step is formed as an alignment mark in the scribing region Rs in order to suppress the displacement in the memory holes when forming the memory holes in the lower-stand part and the upper-stand part of the stacked body in each of the cell regions Rc in the semiconductor memory devices according to the respective embodiments, but the invention is not limited to this example. For example, it is also possible to use the step of each of the embodiments as the alignment mark in the case of forming the contact holes of the peripheral circuits (e.g., transistors) in each of the peripheral regions Rp. In this case, the displacement in forming the contact holes of each of the peripheral regions Rp is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a substrate;
   a first stacked body provided in a first region on the substrate, and including a first insulating film and an electrode film stacked alternately on one another;
   a columnar part provided in the first stacked body, extending in a stacking direction of the first stacked body, and including a connection part widened in width in a first direction along an upper surface of the substrate;
   a second insulating film provided in a second region on the substrate, and having a first thickness in the stacking direction; and
   a second stacked body provided on the second insulating film, and including a first film and a third insulating film stacked alternately on one another,
   an uppermost first film in the second stacked body being located at a first distance in the stacking direction from the upper surface of the substrate, and
   the first thickness is not less than 30 percent of the first distance.

2. The device according to claim 1, wherein
   the second stacked body has a second thickness in the stacking direction from a lowermost layer to the uppermost first film in the first films, and
   the second thickness is not less than 30 percent of the first distance.

3. The device according to claim 1, further comprising:
   a columnar member provided in the second insulating film, and extending in the stacking direction.

4. The device according to claim 3, wherein
   the columnar member includes a columnar member material which is different from a first film material and a third insulating film material.

5. The device according to claim 3, wherein
   the columnar member includes silicon.

6. The device according to claim 3, wherein
   the columnar member includes a widened part widened in width in the first direction, and
   an upper surface of the connection part is located on substantially a same plane as an upper surface of the widened part.

7. The device according to claim 3, wherein
   an upper surface of the columnar member is located above an upper surface of the second insulating film, and
   the second stacked body is provided with a step.

8. The device according to claim 1, wherein
   the first insulating film and the third insulating film include silicon oxide, and
   the first film includes silicon nitride.

9. The device according to claim 1, wherein
   the first stacked body includes a third stacked body and a fourth stacked body, the connection part of the columnar part being located in the third stacked body, the fourth stacked body being provided on the third stacked body,
   the columnar part includes a channel and a charge storage film provided on a side surface of the channel.

10. The device according to claim 1, wherein
    the second region is provided on a periphery of the first region, and
    a third region is located between the first region and the second region on the substrate, a peripheral circuit being provided in the third region.

11. A semiconductor memory device comprising:
    a substrate;
    a first stacked body provided in a first region on the substrate, and including a first insulating film and an electrode film stacked alternately on one another;
    a columnar part provided in the first stacked body, and extending in a stacking direction of the first stacked body;
    a second insulating film provided in a second region on the substrate, and having a first thickness in the stacking direction; and
    a second stacked body provided on the second insulating film, and including a first film and a third insulating film stacked alternately on one another,
    an uppermost first film of the second stacked body being located at a first distance in the stacking direction from an upper surface of the substrate, and
    the first thickness is not less than 30 percent of the first distance.

12. The device according to claim 11, wherein
    the second stacked body has a second thickness in the stacking direction from a lowermost layer to an uppermost first film, and
    the second thickness is not less than 30 percent of the first distance.

13. The device according to claim 11, further comprising:
    a columnar member provided in the second insulating film, and extending in the stacking direction.

14. The device according to claim 13, wherein
    the columnar member includes a columnar member material which is different from a first film material and a third insulating film material.

15. The device according to claim 13, wherein
    the columnar member includes silicon.

16. The device according to claim 13, wherein
    an upper surface of the columnar member is located above an upper surface of the second insulating film, and
    the second stacked body is provided with a step.

17. The device according to claim 11, wherein
    the first insulating film and the third insulating film include silicon oxide, and
    the first film includes silicon nitride.

18. The device according to claim 11, wherein
    the columnar part has a channel and a charge storage film provided on a side surface of the channel.

19. A method for manufacturing a semiconductor memory device, comprising:
    forming a first stacked body by alternately stacking a first insulating film and a first film in each of a first region and a second region on a substrate;
    forming a hollow in the second region by removing the first stacked body in the second region;
    forming a second insulating film in the hollow in the second region;
    forming a plurality of first through holes extending in a stacking direction of the first stacked body in the first stacked body in each of the first region and the second region;
    widening a width of an upper part of each of the first through holes by partially removing the first insulating film of an uppermost layer of the first stacked body in the first region, and partially removing the second insulating film in the second region;
    forming second films in the plurality of first through holes;

exposing upper parts of the second films by partially removing the second insulating film in the second region;

forming a second stacked body having a step in the second region by alternately stacking a third insulating film and a third film on the first stacked body and the second films in the first region, and on the second insulating film and the second film in the second region; and forming a plurality of second through holes extending in the stacking direction and located on the plurality of first through holes in the second stacked body in the first region based on the step in the second region.

20. The method according to claim 19, further comprising:

forming a plurality of third through holes extending in the stacking direction in the first stacked body and the second stacked body by removing the second films in the plurality of first through holes via the plurality of second through holes; and forming semiconductor layers in the third through holes.

* * * * *